(12) United States Patent
Kojima et al.

(10) Patent No.: US 6,496,427 B2
(45) Date of Patent: Dec. 17, 2002

(54) NONVOLATILE SEMICONDUCTOR MEMORY DEVICE

(75) Inventors: Makoto Kojima, Osaka (JP); Hisakazu Kotani, Hyogo (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/924,998

(22) Filed: Aug. 8, 2001

(65) Prior Publication Data

US 2002/0027814 A1 Mar. 7, 2002

(30) Foreign Application Priority Data

Aug. 28, 2000 (JP) ........................................ 2000-257262

(51) Int. Cl.[7] ................................................ G11C 7/00
(52) U.S. Cl. ................... 365/200; 365/218; 365/189.02
(58) Field of Search ........................... 365/200, 230.01, 365/230.06, 218, 189.02, 189.09

(56) References Cited

U.S. PATENT DOCUMENTS 5,999,450 A * 12/1999 Dallabora et al. ..... 365/185.08
6,122,193 A * 9/2000 Shibata et al. ......... 365/185.03
6,320,800 B1 * 11/2001 Saito et al. ................. 365/200

* cited by examiner

Primary Examiner—David Nelms
Assistant Examiner—Thong Le
(74) Attorney, Agent, or Firm—Merchant & Gould P.C.

(57) ABSTRACT

A nonvolatile semiconductor memory device with high repair efficiency prevents over-erasing even if a memory cell is replaced in the word line direction. The nonvolatile semiconductor memory device includes the following: erasing bias circuits for erasing data in normal memory cell arrays and a redundancy memory cell array; erasing decode circuits for decoding defective address information; and redundancy control circuits connected in series so that a preceding stage controls the next in order to store defective address information based on an erasing decode signal and to switch the erasing bias circuits based on the defective address information. In erasing data, the redundancy control circuits switch the erasing bias circuits so as to inhibit the application of an erasing bias to word and source lines connected to control gates of the normal memory cell array that is replaced by the redundant memory cell array and also inhibit the erasing bias application to those connected to control gates of the unused redundant memory cell array.

17 Claims, 24 Drawing Sheets

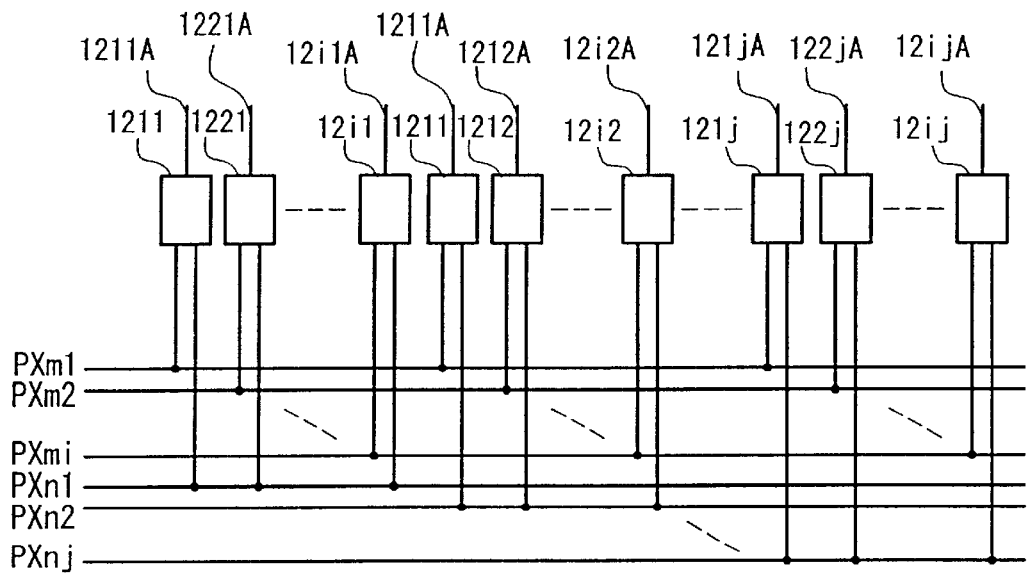
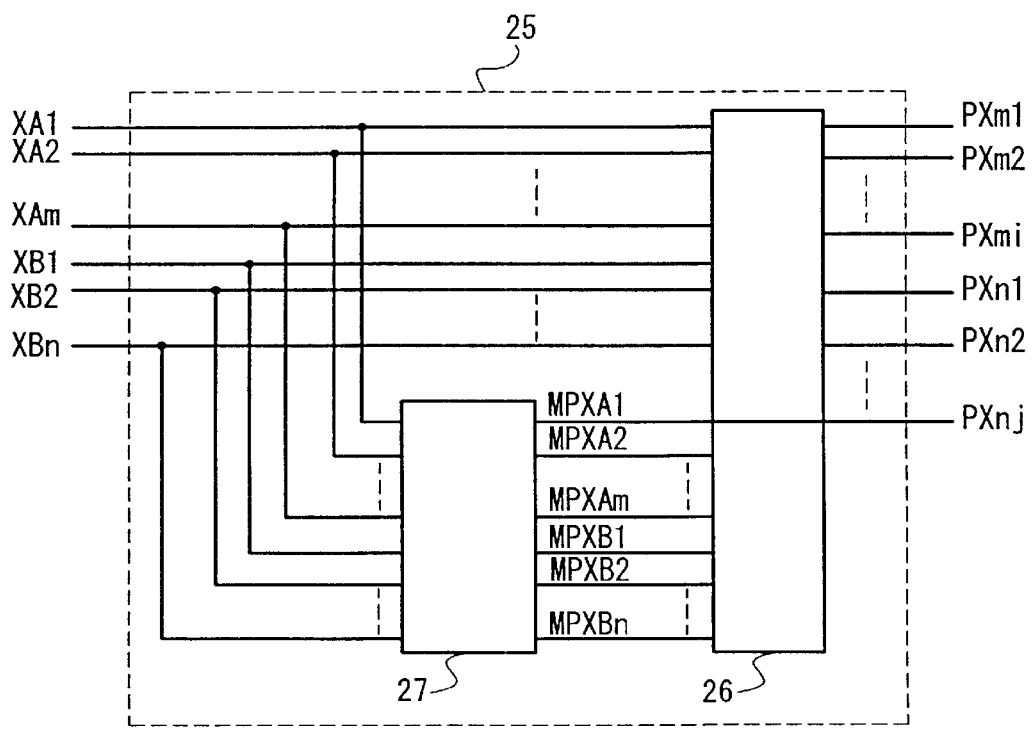
FIG. 13

Erasure decode specification 1

| Address signal | | | | Pre-decode signal | | | | | | | | Erasing block | Address multiplexing |
|---|---|---|---|---|---|---|---|---|---|---|---|---|---|
| XA1 | XA2 | XB1 | XB2 | PXA1 | PXA2 | PXA3 | PXA4 | PXB1 | PXB2 | PXB3 | PXB4 | | |
| 0 | 0 | 0 | 0 | 0 | 0 | 0 | 1 | 0 | 0 | 0 | 1 | 1 | non-multiplexing |
| 0 | 0 | 0 | 1 | 0 | 0 | 0 | 1 | 0 | 0 | 1 | 0 | 2 | |
| 0 | 0 | 1 | 0 | 0 | 0 | 0 | 1 | 0 | 1 | 0 | 0 | 3 | |
| 0 | 0 | 1 | 1 | 0 | 0 | 0 | 1 | 1 | 0 | 0 | 0 | 4 | |
| 0 | 1 | 0 | 0 | 0 | 0 | 1 | 0 | 0 | 0 | 0 | 1 | 5 | |
| 0 | 1 | 0 | 1 | 0 | 0 | 1 | 0 | 0 | 0 | 1 | 0 | 6 | |
| 0 | 1 | 1 | 0 | 0 | 0 | 1 | 0 | 0 | 1 | 0 | 0 | 7 | |
| 0 | 1 | 1 | 1 | 0 | 0 | 1 | 0 | 1 | 0 | 0 | 0 | 8 | |
| 1 | 0 | 0 | 0 | 0 | 1 | 0 | 0 | 0 | 0 | 0 | 1 | 9 | |
| 1 | 0 | 0 | 1 | 0 | 1 | 0 | 0 | 0 | 0 | 1 | 0 | 10 | |
| 1 | 0 | 1 | 0 | 0 | 1 | 0 | 0 | 0 | 1 | 0 | 0 | 11 | |
| 1 | 0 | 1 | 1 | 0 | 1 | 0 | 0 | 1 | 0 | 0 | 0 | 12 | |
| 1 | 1 | 0 | 0 | 1 | 0 | 0 | 0 | 0 | 0 | 0 | 1 | 13 | |
| 1 | 1 | 0 | 1 | 1 | 0 | 0 | 0 | 0 | 0 | 1 | 0 | 14 | |
| 1 | 1 | 1 | 0 | 1 | 0 | 0 | 0 | 0 | 1 | 0 | 0 | 15 | |
| 1 | 1 | 1 | 1 | 1 | 0 | 0 | 0 | 1 | 0 | 0 | 0 | 16 | |

F I G. 1 4 A

Erasure decode specification 2

| Address signal | | | | Pre-decode signal | | | | | | | | Erasing block | Address multiplexing |
|---|---|---|---|---|---|---|---|---|---|---|---|---|---|
| XX1 | XA2 | XB1 | XB2 | PXA1 | PXA2 | PXA3 | PXA4 | PXB1 | PXB2 | PXB3 | PXB4 | | |
| 0 | 0 | 0 | 0 | 0 | 0 | 0 | 1 | 0 | 0 | 1 | 1 | 1 | XB2 multiplexing |
| 0 | 0 | 0 | 1 | 0 | 0 | 0 | 1 | 0 | 0 | 1 | 1 | | |
| 0 | 0 | 1 | 0 | 0 | 0 | 0 | 1 | 1 | 1 | 0 | 0 | 2 | XB2 multiplexing |
| 0 | 0 | 1 | 1 | 0 | 0 | 0 | 1 | 1 | 1 | 0 | 0 | | |
| 0 | 1 | 0 | 0 | 0 | 0 | 1 | 0 | 0 | 0 | 1 | 1 | 3 | XB2 multiplexing |
| 0 | 1 | 0 | 1 | 0 | 0 | 1 | 0 | 0 | 0 | 1 | 1 | | |
| 0 | 1 | 1 | 0 | 0 | 0 | 1 | 0 | 1 | 1 | 0 | 0 | 4 | XB2 multiplexing |
| 0 | 1 | 1 | 1 | 0 | 0 | 1 | 0 | 1 | 1 | 0 | 0 | | |
| 1 | 0 | 0 | 0 | 0 | 1 | 0 | 0 | 1 | 1 | 1 | 1 | 5 | XB1,2 multiplexing |
| 1 | 0 | 0 | 1 | 0 | 1 | 0 | 0 | 1 | 1 | 1 | 1 | | |
| 1 | 0 | 1 | 0 | 0 | 1 | 0 | 0 | 1 | 1 | 1 | 1 | | |
| 1 | 0 | 1 | 1 | 0 | 1 | 0 | 0 | 1 | 1 | 1 | 1 | | |
| 1 | 1 | 0 | 0 | 1 | 0 | 0 | 0 | 1 | 1 | 1 | 1 | | |
| 1 | 1 | 0 | 1 | 1 | 0 | 0 | 0 | 1 | 1 | 1 | 1 | | |
| 1 | 1 | 1 | 0 | 1 | 0 | 0 | 0 | 1 | 1 | 1 | 1 | | |
| 1 | 1 | 1 | 1 | 1 | 0 | 0 | 0 | 1 | 1 | 1 | 1 | | |

F I G. 1 4 B

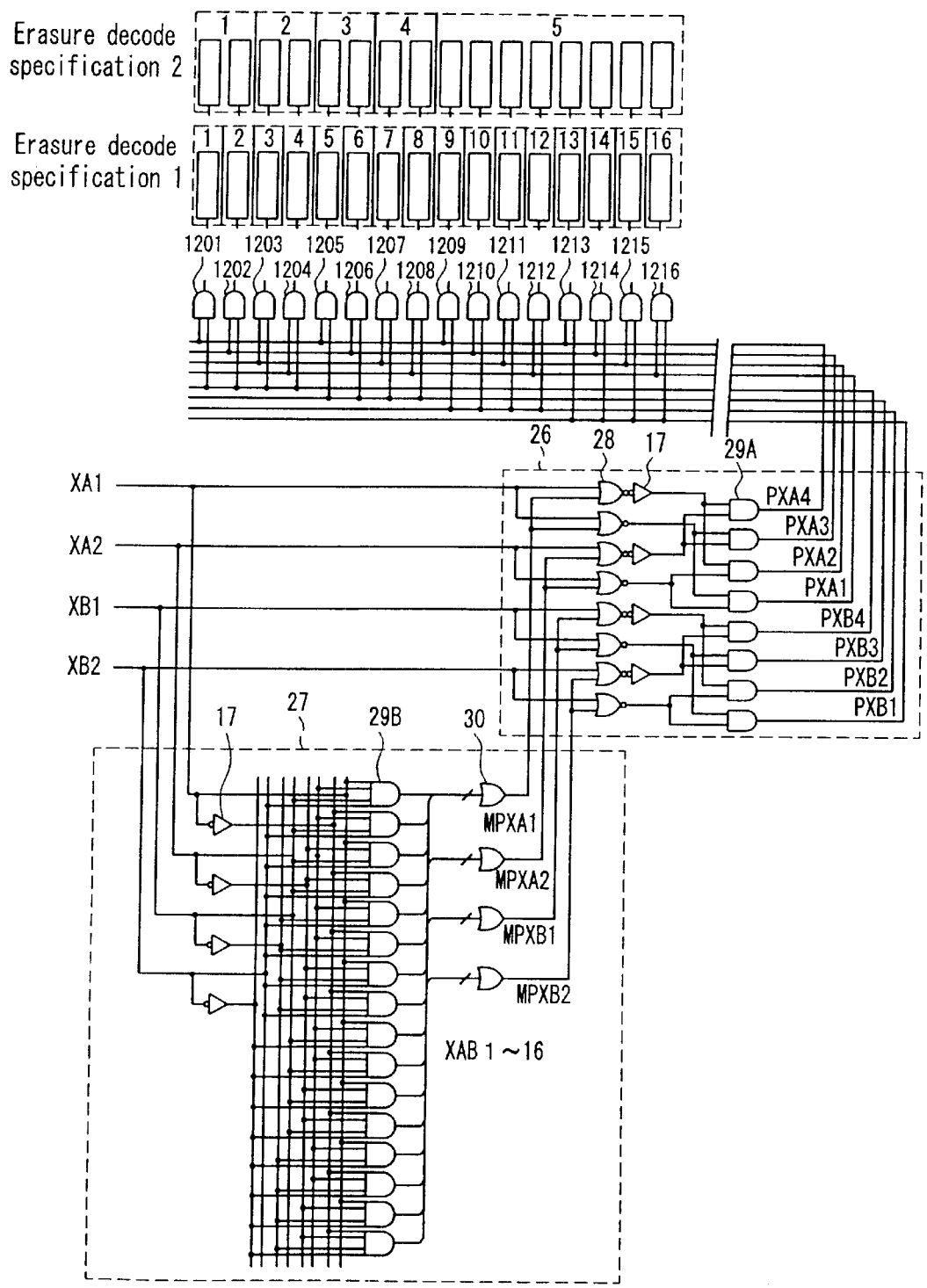
F I G. 15

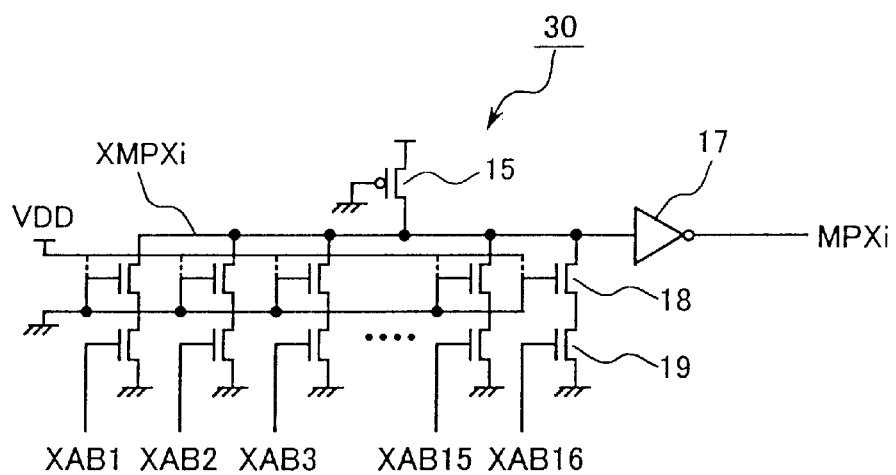
F I G. 1 6
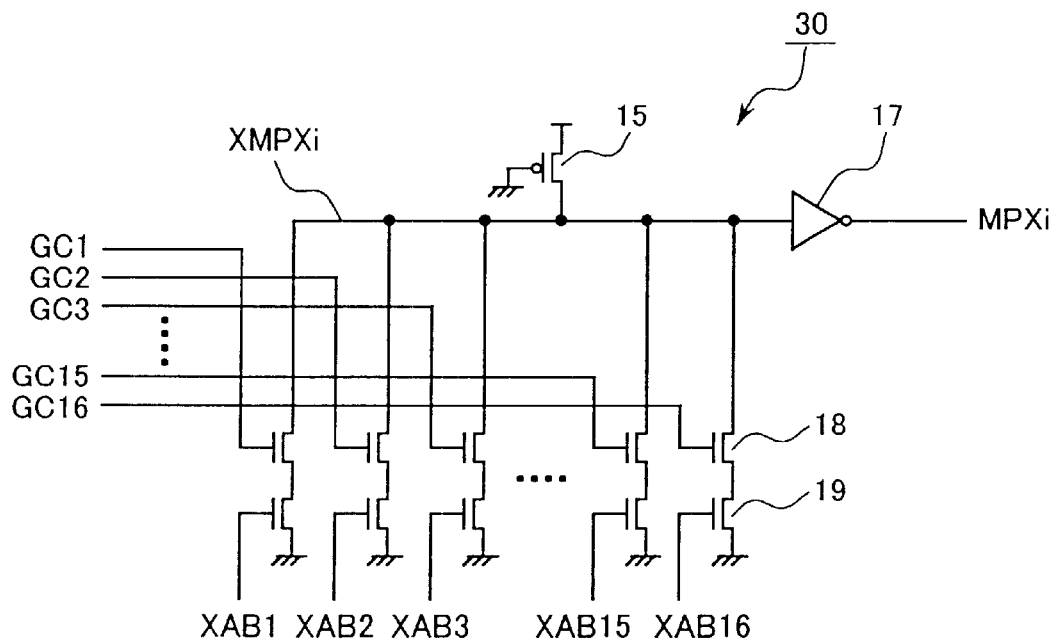
F I G. 1 7

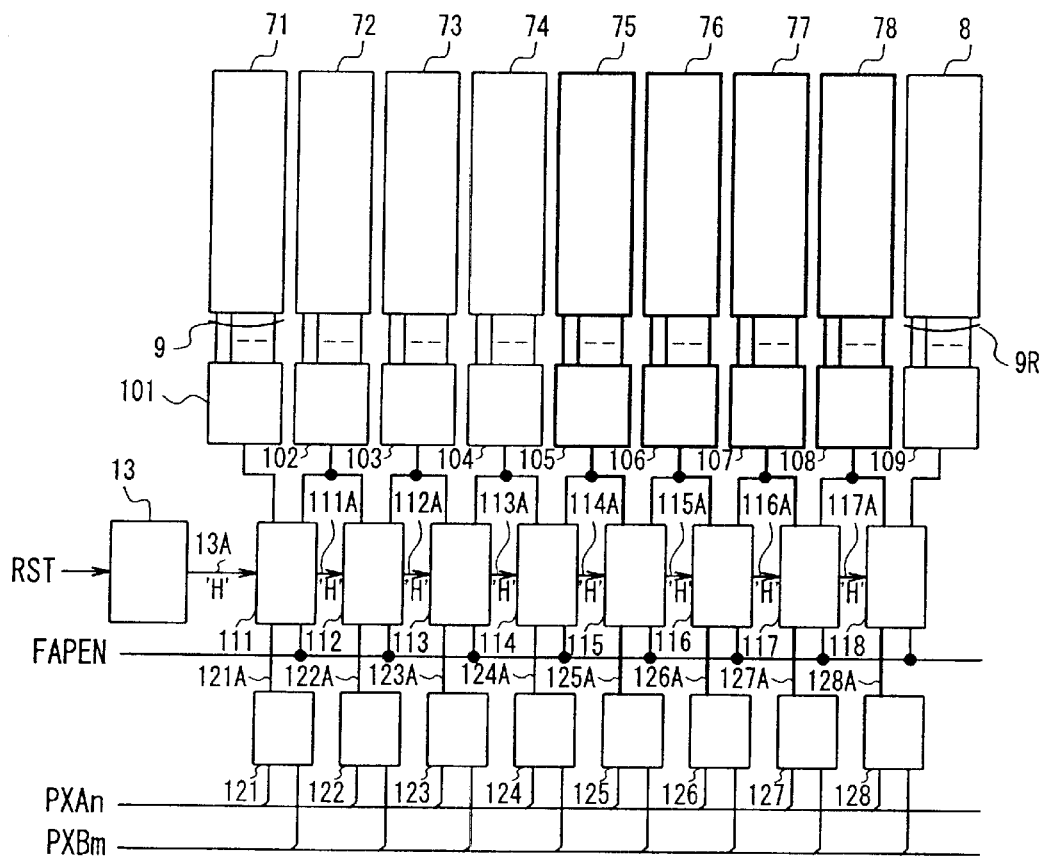
F I G. 21

NONVOLATILE SEMICONDUCTOR MEMORY DEVICE

BACKGROUND OF THE INVENTION

1. Field of the Invention

The present invention relates to a nonvolatile semiconductor memory device that stores information in floating gates.

2. Description of the Related Art

A nonvolatile semiconductor memory stores information by the presence or absence of charge accumulated on floating gates. Examples of such a nonvolatile semiconductor memory include a flash memory, which erases information in memory cells simultaneously. FIG. 24 shows the configuration of a conventional flash memory array. In FIG. 24, reference numeral 1 is a nonvolatile memory cell including a floating gate and a control gate, 2 is a word line connected to the control gate of the nonvolatile memory cell 1, 3 is a bit line, and 4 is a source line. As shown in FIG. 24, each nonvolatile memory cell 1 is formed independently at the intersection of the word line 2 and the bit line 3.

To erase data from the nonvolatile memory cells 1, a high voltage is applied to the word lines 2 and the source lines 4. At the time of erasing, the same voltage VNEG is applied to all the word lines via switching elements 5 selected by an erasing block decoder 6. For reading and writing, each of the nonvolatile memory cells is selected independently by a selecting circuit (not shown in FIG. 24). Like the word lines 2, the same voltage VPOS is applied simultaneously to the source lines 4 during erasing. In other words, data is erased at once during erasing.

The nonvolatile memory includes a redundant memory cell array 8, which is located adjacent to a normal memory cell array 7, to repair memory defects in a redundant manner. The normal memory cell array 7 and the redundant memory cell array 8 share the bit lines 3. When a redundant word line 2R is used, the word line having a defective bit is not used.

However, an erasing voltage is applied to the cells connected to the defective word line because the erasing circuit is the same. Consequently, those cells are over-erased, compared with the cells connected to other normal word lines 2. Thus, the memory cells connected to the defective word line are depleted to cause bit-line leakage during reading, resulting in malfunction.

To solve the problem, e.g., JP 7(1995)-230700 A discloses a method for preventing the application of an erasing bias to the source line of a replaced defective cell. Using this method, however, the erasing bias is applied to the word line. Therefore, charge is drawn from the floating gate, which may cause over-erasing.

There is another method in which a redundant word line is provided or each erasing block, as shown in FIG. 25. For example, when a second formal erasing block 72 is found to be defective, it is replaced by a redundant erasing block 8, as shown in FIG. 25. Since the second normal erasing block 72 is not accessed permanently, no erasing bias is applied thereto. Therefore, such over-erasing as described above does not occur.

However, the erasing block is usually composed of tens to hundreds of kilobits as a unit, and the size of a unit to be replaced for one defective cell is the same as that of the erasing block. Thus, the repair efficiency is rather poor.

SUMMARY OF THE INVENTION

Therefore, with the foregoing in mind, it is an object of the present invention to provide a nonvolatile semiconductor memory device that can prevent over-erasing even if a memory cell is replaced in the word line direction and provide high repair efficiency.

To achieve the above object, a first nonvolatile semiconductor memory device of the present invention includes: N (N is a natural number) normal memory cell arrays, a redundant memory cell array, (N+1) erasing bias circuits, N erasing decode circuits, and N redundancy control circuits. Each of the N normal memory cell arrays includes the arrangement of two or more nonvolatile memory cells, each having a control gate and a floating gate. The redundant memory cell array includes the arrangement of two or more nonvolatile memory cells, each having the same configuration as that of the nonvolatile memory cell in the normal memory cell array. The (N+1) erasing bias circuits apply an erasing bias for erasing data stored in the N normal memory cell. arrays and the redundant memory cell array. The N erasing decode circuits decode defective address information. The N redundancy control circuits are connected in series so that a preceding stage controls the next in order to store the defective address information for switching the (N+1) erasing bias circuits based on the defective address information responsive to output signals from the respective N erasing decode circuits. The (N+1) erasing bias circuits inhibit application of the erasing bias to word and source lines connected to the control gates of any one of the N normal memory cell arrays that is replaced by the redundant memory cell array and also inhibit application of the erasing bias to word and source lines connected to the control gates of the unused redundant memory cell array under a switching operation by the N redundancy control circuits in erasing data.

In the first nonvolatile semiconductor memory device, it is preferable that the size of an array of the N normal memory cell arrays is the same as that of the redundant memory cell array and is equal to or less than that of a minimum erasing block.

In the first nonvolatile semiconductor memory device, it is preferable that the (N+1) erasing bias circuits apply the erasing bias to any number of memory cell arrays among the N normal memory cell arrays and the redundant memory cell array under a switching operation by the N redundancy control circuits based on output signals from the N erasing decode circuits.

In the first nonvolatile semiconductor memory device, it is preferable that each of the N redundancy control circuits includes an input terminal, a first output terminal, and a second output terminal. The input terminal receives an output signal from the erasing decode circuit and a defective address program activation signal. The first output terminal switches an erasing bias activation signal and outputs it to one of the adjacent erasing bias circuits, and the second output terminal switches the erasing bias activation signal and outputs it to the other erasing bias circuit. It is also preferable that the second output terminal of one of the adjacent redundancy control circuits and the first output terminal of the other redundancy control circuit are connected in common. Each of the N redundancy control circuits stores the defective address information based on the output signal from the erasing decode circuit when the defective address program activation signal is activated, and among the N redundancy control circuits, a redundancy control circuit storing the defective address information controls the next redundancy control circuit so as to switch the terminals for outputting the erasing bias activation signal.

The above configuration can eliminate over-erased memory cells because no erasing bias is applied to the unused word and source lines of a memory cell array. Therefore, it can prevent malfunction due to bit-line leakage. Moreover, this configuration enables the replacement of a normal memory cell array by a redundant memory cell array for each word line, thus providing a higher repair efficiency than that of a conventional replacement for each erasing block.

In the first nonvolatile semiconductor memory device, it is preferable that each of the N redundancy control circuits includes a nonvolatile memory cell having a control gate and a floating gate to store the defective address information.

In such a case, it is preferable that each of the N redundancy control circuits includes the following: a nonvolatile memory cell having a gate connected to the preceding redundancy control circuit, a source connected to a first power line, and a drain connected to a common node; a first PMOS transistor having a gate connected to the gate of the nonvolatile memory cell, a source connected to a second power line, and a drain connected to the common node; a second PMOS transistor having a gate connected to the next redundancy control circuit, a source connected to the second power line, and a drain connected to the common node; an inverter having an input terminal connected to the common node and an output terminal connected to the gate of the second PMOS transistor; a first NMOS transistor having a gate receiving the defective address program activation signal, a drain connected to the common node, and a source receiving the defective address information from the erasing decode circuit; a second NMOS transistor having a gate connected to the output terminal of the inverter, a source acting as the first output terminal for switching the erasing bias activation signal to be output, and a drain connected to the source of the first NMOS transistor; and a third NMOS transistor having a gate connected to the input terminal of the inverter, a source acting as the second output terminal for switching the erasing bias activation signal to be output, and a drain connected to the source of the first NMOS transistor.

According to this configuration, defective address information is stored in the redundancy control circuit via an erasing decode signal. Therefore, only the defective address program activation signal FAPEN is used as a redundancy control signal. Thus, many signals for redundancy decoding are not necessary, which enables the replacement for each word line with a simple layout.

Alternatively, in the first nonvolatile semiconductor memory device, it is preferable that each of the N redundancy control circuits includes a static memory cell having two inverters to store the defective address information.

In such a case, it is preferable that each of the N redundancy control circuits includes the following: a static memory cell having first and second inverters, where an input terminal of the first inverter is connected to an output terminal of the second inverter, while an output terminal of the first inverter is connected to an input terminal of the second inverter; a first NMOS transistor having a gate receiving the defective address program activation signal, a drain connected to one input/output terminal of the static memory cell, and a source receiving the defective address information from the erasing decode circuit; a second NMOS transistor having a gate connected to the other input/output terminal of the static memory cell and a source connected to a first power line; a third NMOS transistor having a gate connected to the preceding redundancy control circuit, a drain connected to a common node, and a source connected to the drain of the second NMOS transistor; a first PMOS transistor having a gate connected to the gate of the third NMOS transistor, a drain connected to the common node, and a source connected to a second power line; a second PMOS transistor having a gate connected to the next redundancy control circuit, a source connected to the second power line, and a drain connected to the common node; a third inverter having an input terminal connected to the common node and an output terminal connected to the gate of the second PMOS transistor; a fourth NMOS transistor having a gate connected to the output terminal of the third inverter, a source acting as the first output terminal for switching the erasing bias activation signal to be output, and a drain connected to the source of the first NMOS transistor; and a fifth NMOS transistor having a gate connected to the input terminal of the third inverter, a source acting as the second output terminal for switching the erasing bias activation signal to be output, and a drain connected to the source of the first NMOS transistor.

This configuration employs the static memory cell to store defective address information. Therefore, it is not necessary to apply a high voltage, which eliminates the need for a device with a high withstand voltage. Thus, a large separation width, longer channel length, channel offset, and the like are not required to maintain a withstand voltage, simplifying the layout.

To achieve the above object, a second nonvolatile semiconductor memory device of the present invention includes an erasing pre-decode circuit and erasing decode circuits: the erasing pre-decode circuit receives a plurality of erasing address signals and outputs a plurality of first and second erasing pre-decode signals; the erasing decode circuits receive the first and second erasing pre-decode signals and output a plurality of erasing decode signals. Any combination of the erasing address signals activates the desired number of erasing pre-decode signals of the first and second erasing pre-decode signals so that the desired number of erasing decode signals are activated.

This configuration can set the size of a block to be erased in a nonvolatile memory array flexibly with the same erasing decode circuit. Thus, modification of the erasing circuit can be made easily in accordance with the use of a memory chip.

In the second nonvolatile semiconductor memory device, it is preferable that the erasing pre-decode circuit includes an address degeneration circuit and a multiplex pre-decode circuit: the address degeneration circuit receives the erasing address signals and outputs the same number of address degeneration signals as that of the erasing address signals; the multiplex pre-decode circuit receives the erasing address signals and the address degeneration signals and outputs the erasing pre-decode signals. A combination of the erasing address signals generates any address degeneration signal so as to degenerate any address of the erasing address signals and thus any of the erasing pre-decode signals are multiplexed.

This configuration provides the address degeneration circuit and the multiplex pre-decode circuit separately. Therefore, the erasing pre-decode signals can be combined for multiplexing with the same erasing pre-decode circuit and only by modifying the contents of the address degeneration circuit. Thus, modification of the erasing circuit can be made easily in accordance with the use of a memory chip.

In such a case, it is preferable that the address degeneration circuit includes a decoder and a group of combinatorial logic elements: the decoder receives the erasing address signals; the group of combinatorial logic elements receives all outputs from the decoder and outputs the address degeneration signals. It is also preferable that the group of combinatorial logic elements includes OR circuits, each receiving the same number of control signals as that of the erasing address signals and outputting the address degeneration signal in accordance with a combination of the erasing address signals and the control signals. Moreover, it is preferable that the control signals are stored in an information storage means located separately from the address degeneration circuit on the same substrate.

This configuration can change the combinations for address degeneration by changing the states of the control signals in the same chip. Thus, the size of a block to be erased can be changed in the same chip, allowing the device to be used for many applications.

In the second nonvolatile semiconductor memory device, it is preferable that the group of combinatorial logic elements includes OR circuits, each including the same number of nonvolatile memory cells as that of the erasing address signals; control gates of the nonvolatile memory cells are each supplied with the erasing address signal and drains thereof are connected in common to form an output node of the OR circuit; and the OR circuit outputs the address degeneration signal in accordance with a combination of the erasing address signals and information stored in the nonvolatile memory cells. In such a case, it is preferable that desired information is stored in the nonvolatile memory cells by supplying the erasing address signals to each of the control gates of the nonvolatile memory cells and applying a desired voltage to the output node of the OR circuit.

This configuration can change the combinations for address degeneration by modifying the contents of the nonvolatile memory cells in the address degeneration circuit in the same chip. Thus, the size of a block to be erased can be changed in the same chip, allowing the device to be used for many applications. Moreover, the number of excess control signal lines can be reduced, so that a smaller layout area can be achieved.

It is preferable that the first nonvolatile semiconductor memory device further includes an erasing pre-decode circuit including an address degeneration circuit and a multiplex pre-decode circuit: the address degeneration circuit receives a plurality of erasing address signals and outputs the same number of address degeneration signals as that of the erasing address signals; the multiplex pre-decode circuit receives the erasing address signals and the address degeneration signals and outputs a plurality of first and second erasing pre-decode signals. It is also preferable that the erasing decode circuits receive the first and second erasing pre-decode signals from the erasing pre-decode circuit and output erasing decode signals, with which any number of normal memory cell arrays in a plurality of combinations are activated so as to repair a defective address of any one of those normal memory cell arrays. In such a case, it is preferable that the erasing decode circuits are shared in an erasing mode and a program mode, and the number of source lines to be selected in the program mode is made smaller than that in the erasing mode by changing the activated address degeneration signals depending on the erasing and program modes.

According to this configuration, the number of source lines to which a bias is applied in the program mode can be made smaller than that in the erasing mode. Thus, source-line disturbance can be reduced, thereby ensuring high reliability.

BRIEF DESCRIPTION OF THE DRAWINGS

FIG. 13 is a block diagram showing the configurations of erasing decode circuits and an erasing pre-decode circuit in a nonvolatile semiconductor memory device according to a third embodiment of the present invention.

FIG. 14A shows the relationship of erasing pre-decode signals to erasing address signals according to a conventional system.

FIG. 14B shows the relationship of erasing pre-decode signals to erasing address signals according to a system of the third embodiment.

FIG. 15 is a circuit diagram showing a specific example of the circuits in FIG. 13.

FIG. 16 is a circuit diagram showing an internal configuration of a first specific example of the OR circuit 30 in FIG. 15.

FIG. 17 is a circuit diagram showing an internal configuration of a second specific example of the OR circuit 30 in FIG. 15.

FIG. 21 shows the operation of the memory array in FIG. 19 when the outputs from the erasing decode circuits 125 to 128 are multiplexed.

DESCRIPTION OF THE PREFERRED EMBODIMENTS

Hereinafter, the preferred embodiments of the present invention will be described with reference to the accompanying drawings.

First Embodiment

Figure 1:
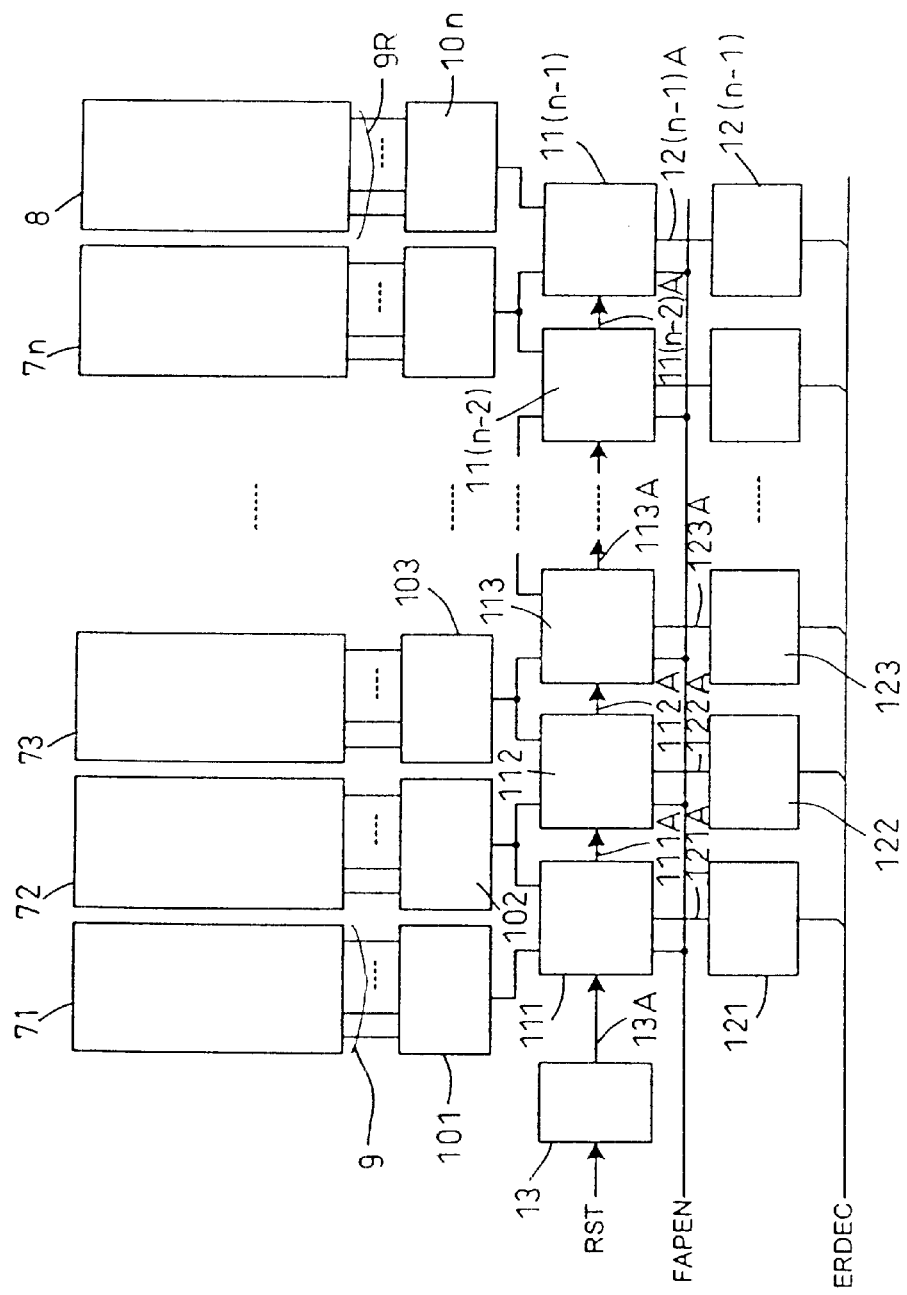
FIG. 1 shows the configuration of a memory cell array in a nonvolatile semiconductor memory device according to a first embodiment of the present invention.

FIG. 1 shows the configuration of a memory cell array in a nonvolatile semiconductor memory device of a first embodiment of the present invention.

In FIG. 1, reference numerals 71, 72, 73, . . . , 7n are normal memory cell arrays, 8 is a redundant memory cell array, 9 is word and source lines of the normal memory cell arrays 71 to 7n, 9R is word and source lines of the redundant memory cell array 8, 101, 102, 103, . . . , 10n are erasing bias circuits, 111, 112, 113, . . . 1, 1(n−1) are redundancy control circuits, 121, 122, 123, . . . , 12(n−1) are erasing decode circuits, 13 is an initialization circuit, FAPEN is a defective address program activation signal, ERDEC is an erasing address line, and RST is an initialization signal.

For a detailed description of this embodiment, first, the redundancy control circuits 111 to 11(n−1) will be described.

As shown in FIG. 1, the (n−1) redundancy control circuits 111 to 11(n−1) are connected in series, and the redundancy control circuit 111 in the first stage is connected to the initialization circuit 13. Each of the redundancy control circuits 111 to 11(n−1) has a storage means for storing defective address information. The replacement of any one of the normal memory cell arrays 71 to 7n by the redundant memory cell array 8 is performed with the following: the redundancy control circuits 111 to 11 (n−1) connected in series; an output signal 13A from the initialization circuit 13 or output signals 111A to 11(n−2)A from the respective redundancy control circuits 111 to 11(n−2); and defective address information stored in the redundancy control circuits 111 to 11(n−1).

Next, the procedure for replacing any one of the normal memory cell arrays 71 to 7n by the redundant memory cell array 8 will be described with reference to FIG. 1 and FIGS. 2 to 4.

(1) Defective address information is stored in the redundancy control circuits 111 to 11(n−1).

First, defective address information is transmitted from the outside of a chip or a defective address program area (not shown) to the erasing decode line ERDEC. Then, any one of output signals 121A to 12(n−1)A from the respective erasing decode circuits 121 to 12(n−1) has a logic "H" level. At the same time, the defective address program activation signal FAPEN is activated, so that the defective address information is stored in a defective address storage area of any one of the redundancy control circuits 111 to 11(n−1). Among the redundancy control circuits 111 to 11(n−1), the circuit containing the defective address information transmits an inversion signal of the preceding stage to the next, while other redundancy control circuits without the address defective information transmit a signal having the same level as the preceding stage to the next.

(2) To initialize the redundancy control circuits 111 to 11(n−1), an output signal 13A from the initialization circuit 13 is set, e.g., to a logic "L" level by activating the initialization signal RST applied to the initialization circuit 13.

Figure 2:
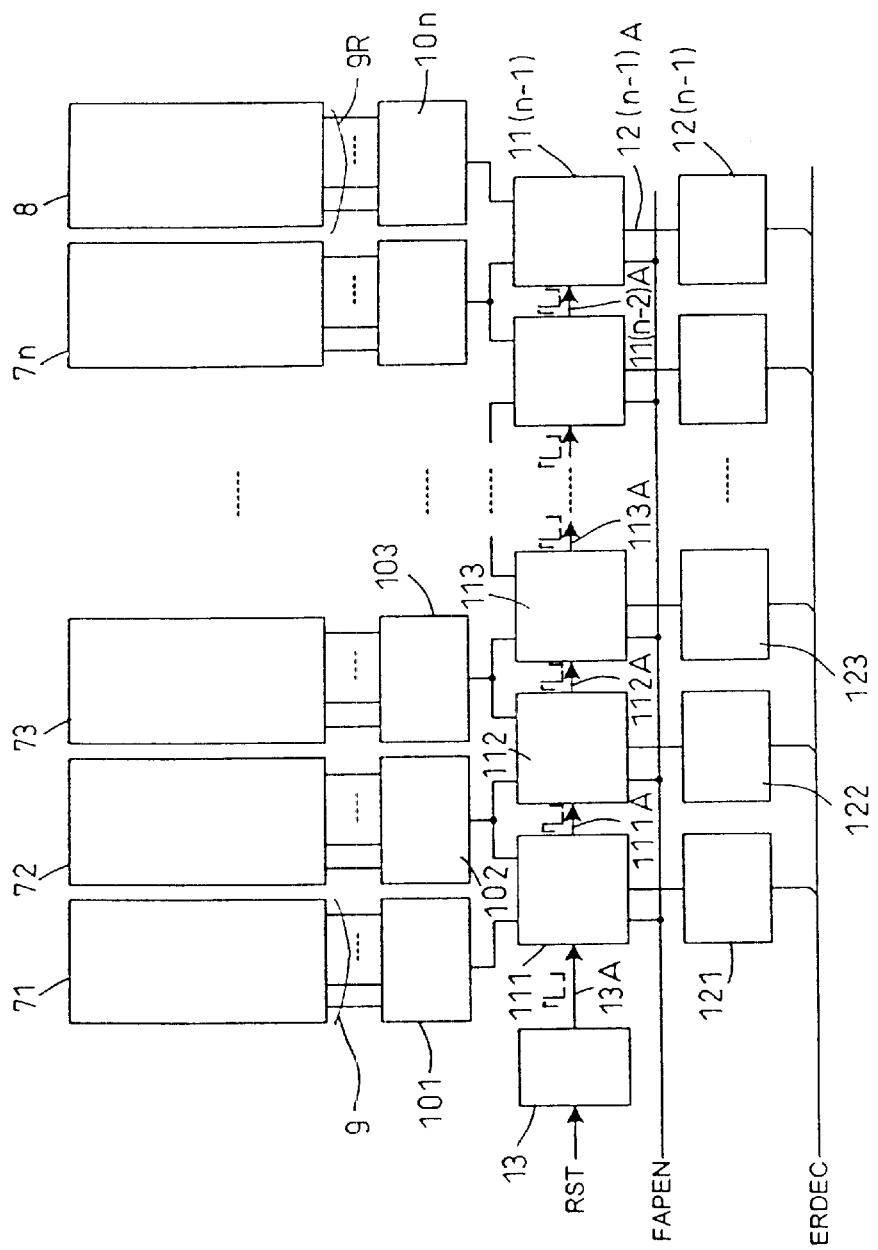
FIG. 2 illustrates an initializing operation of a nonvolatile semiconductor memory device according to the first embodiment.

At this time, each of the output signals 111A to 11(n−2)A from the redundancy control circuits 111 to 11(n−1) also has a logic "L" level, see FIG. 2.

(3) An output signal 13A from the initialization circuit 13 is set, e.g. to a logic "H" level by inactivating the initialization signal RST.

At this time, the output signals 111A to 11(n−2)A from the respective redundancy control circuits 111 to 11(n−2) connected in series are transmitted successively, from one stage to the next. The condition of transmission differs depending on defective address information.

When no defect is found, signals 111A to 11(n−2)A, each having a "H" level, are transmitted to the redundancy control circuits 112 to 11(n−1), respectively, based on the output signal 13A of "H" level from the initialization circuit 13 to the redundancy control circuit 111. See FIG. 3.

Figure 4:
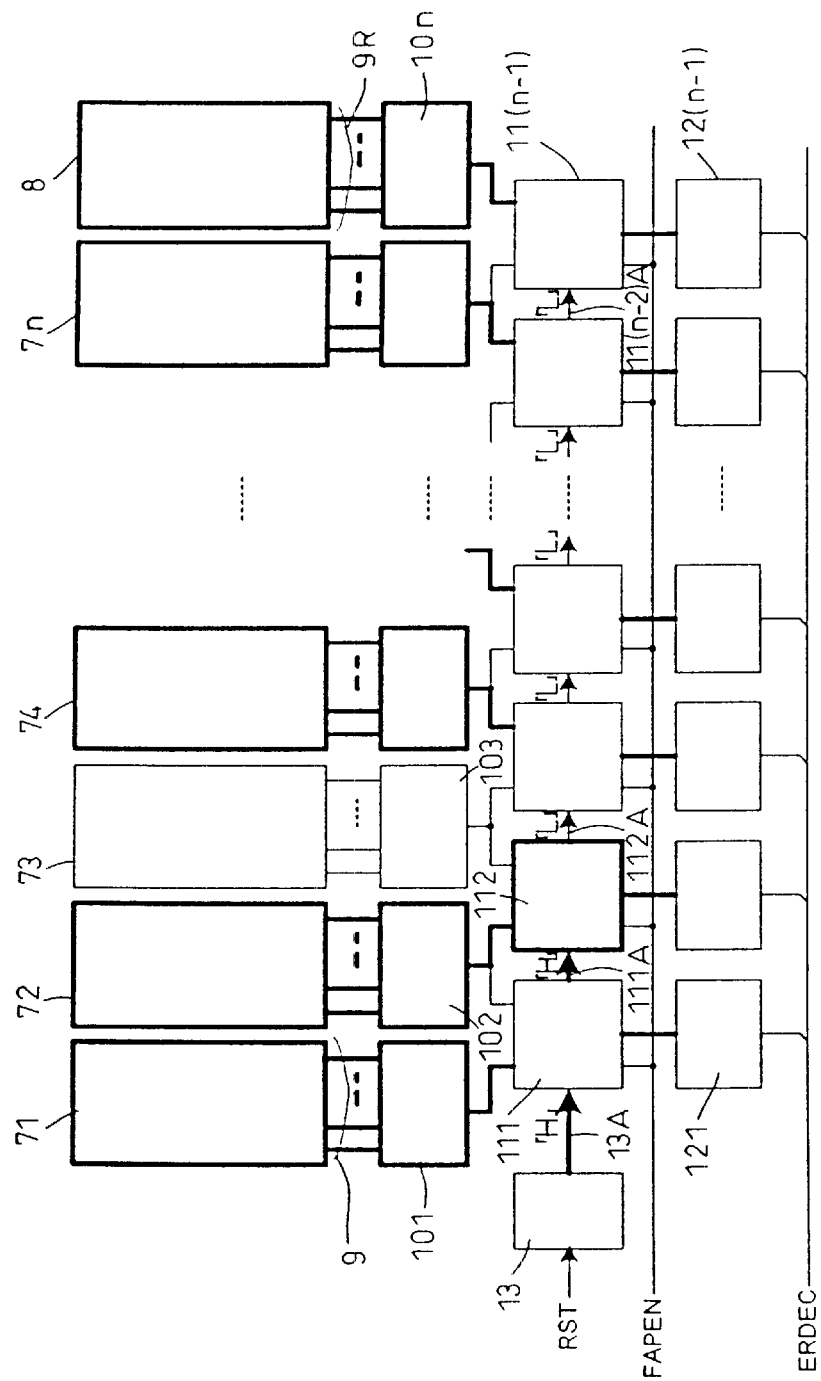
FIG. 4 illustrates an operation of a nonvolatile semiconductor memory device according to the first embodiment when a defect is found in the memory cells.

When a defect is found, e.g., defective address information is stored in the redundancy control circuit 112 as shown in FIG. 4, the redundancy control circuit 112 outputs a signal 112A of "L" level, which is obtained by inverting a signal 111A of "H" level from the preceding redundancy control circuit 111. The signal of "L" level is transmitted to the next redundancy control circuits 113 to 11(n−1). See FIG. 4.

(4) All output signals 121A to 12(n−1)A from the erasing decode circuits 121 to 12(n−1) are activated (e.g., the signals of "H" level are output) by activating the erasing decode signal ERDEC applied to the erasing decode circuits 121 to 12(n−1).

The output signals 121A to 12(n−1)A, being output simultaneously from the erasing decode circuits 121 to 12(n−1), are input to the corresponding redundancy control circuits 111 to 11(n−1). Among the redundancy control circuits 111 to 11(n−1), a redundancy control circuit that has received an output signal of "H" level from the preceding stage transmits a signal to one of the erasing bias circuits 101 to 10n that is connected to the redundancy control circuit on its left side, as shown in FIGS. 3 and 4.

Figure 3:
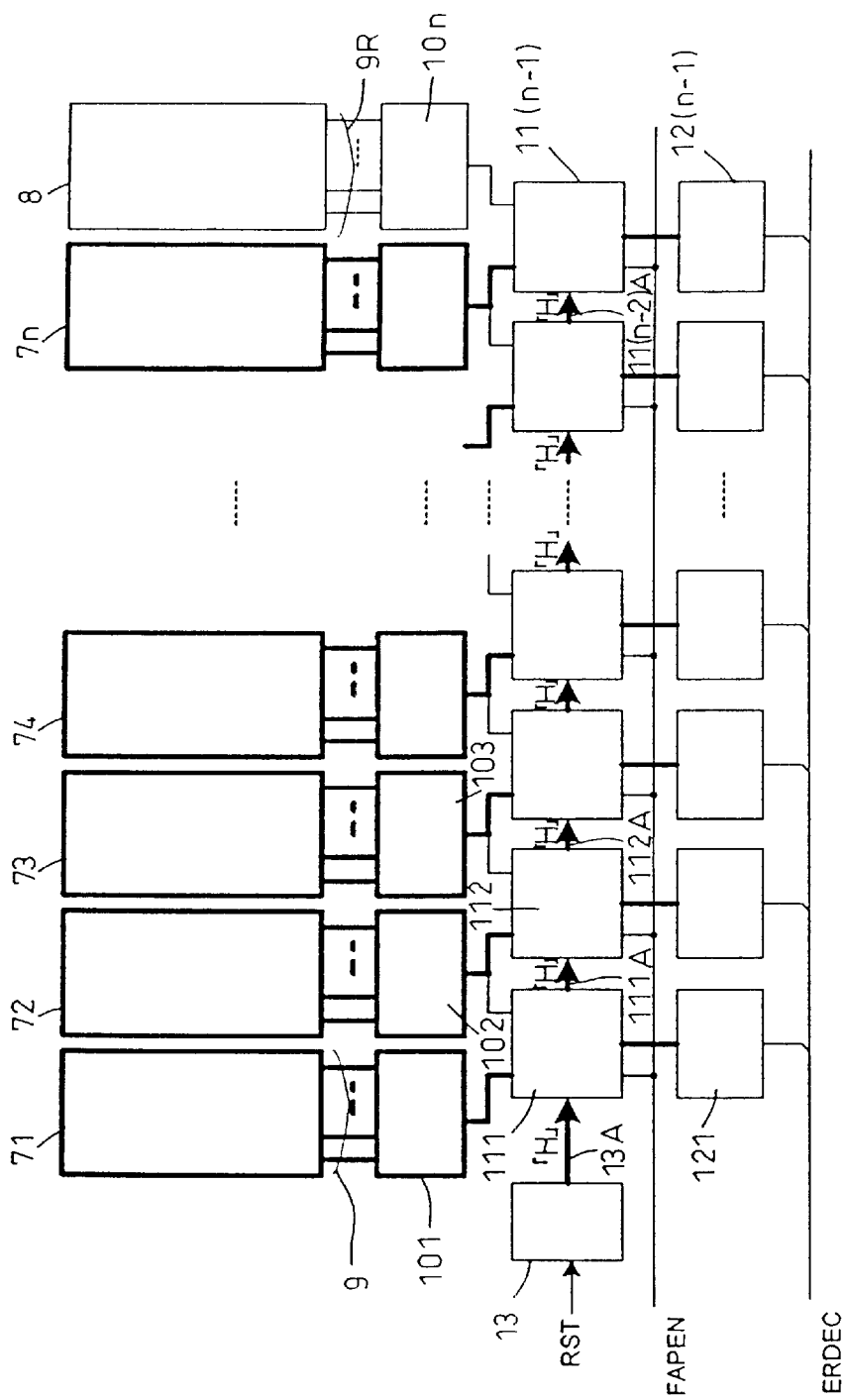
FIG. 3 illustrates an operation of a nonvolatile semiconductor memory device according to the first embodiment when no defect is found in the memory cells.

On the other hand, a redundancy control circuit that has received an output signal of "L" level from the preceding stage transmits a signal to one of the erasing bias circuits 101 to 10n that is connected to the redundancy control circuit on its right side, as shown in FIGS. 3 and 4.

As a result, in erasing the normal memory cell arrays 71 to 7n including no defect, only the redundant memory cell array 8 is unselected and all the normal memory cell arrays 71 to 7n are selected (i.e., the portion represented by a thick line in FIG. 3).

In the case of defects, only the normal memory cell array 73 connected to the erasing decode circuit 112 is unselected among the normal memory cell arrays 71 to 7n, as shown in FIG. 4. Thus, no erasing bias is applied to the unselected normal memory cell array 73, i.e., the potential of word and source lines connected to the unselected normal memory cell array 73 is fixed to a ground potential, preventing over-erasing.

As described above, this embodiment can eliminate over-erased memory cells because no erasing bias is applied to the unused word and source lines of a normal memory cell array. Therefore, it can prevent malfunction due to bit-line leakage. Moreover, this embodiment enables the replacement of a normal memory cell array by a redundant memory cell array for each word line, thus providing a higher repair efficiency than that of a conventional replacement for each erasing block.

Figure 5:
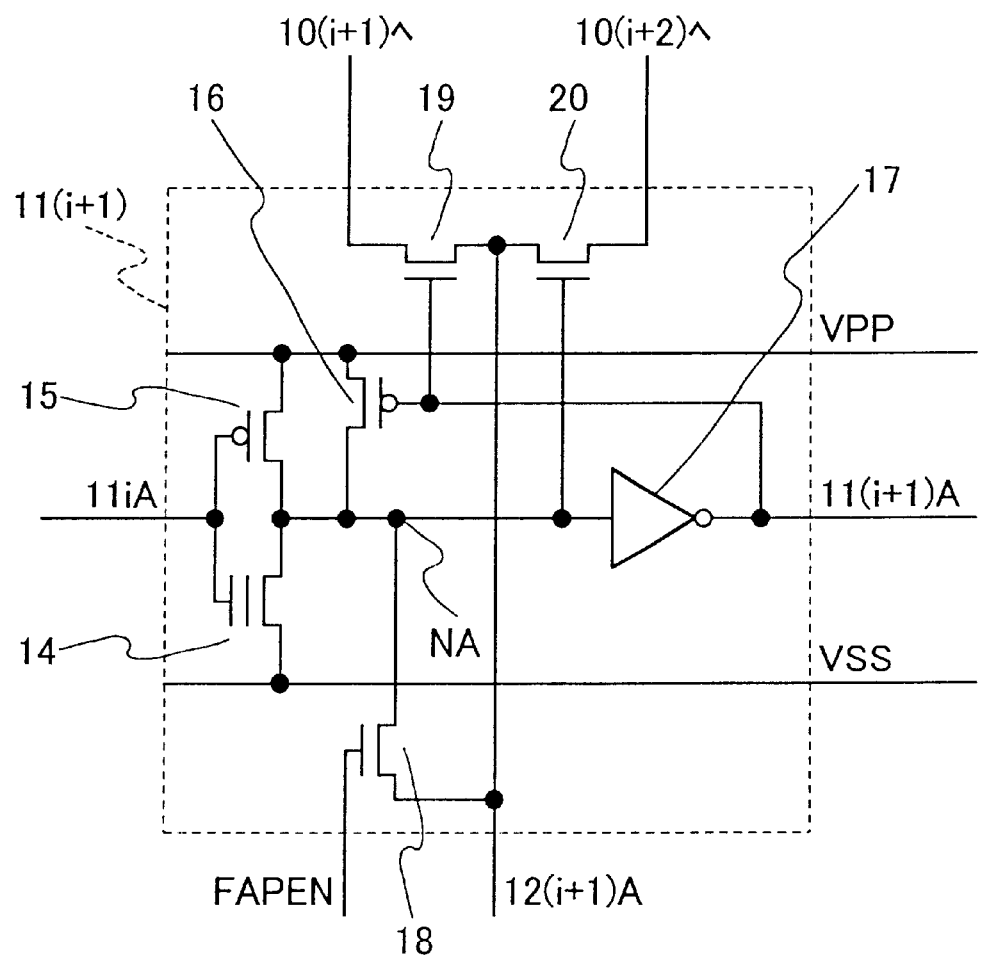
FIG. 5 is a circuit diagram showing the internal configuration of the redundancy control circuit in FIG. 1.
Figure 6:
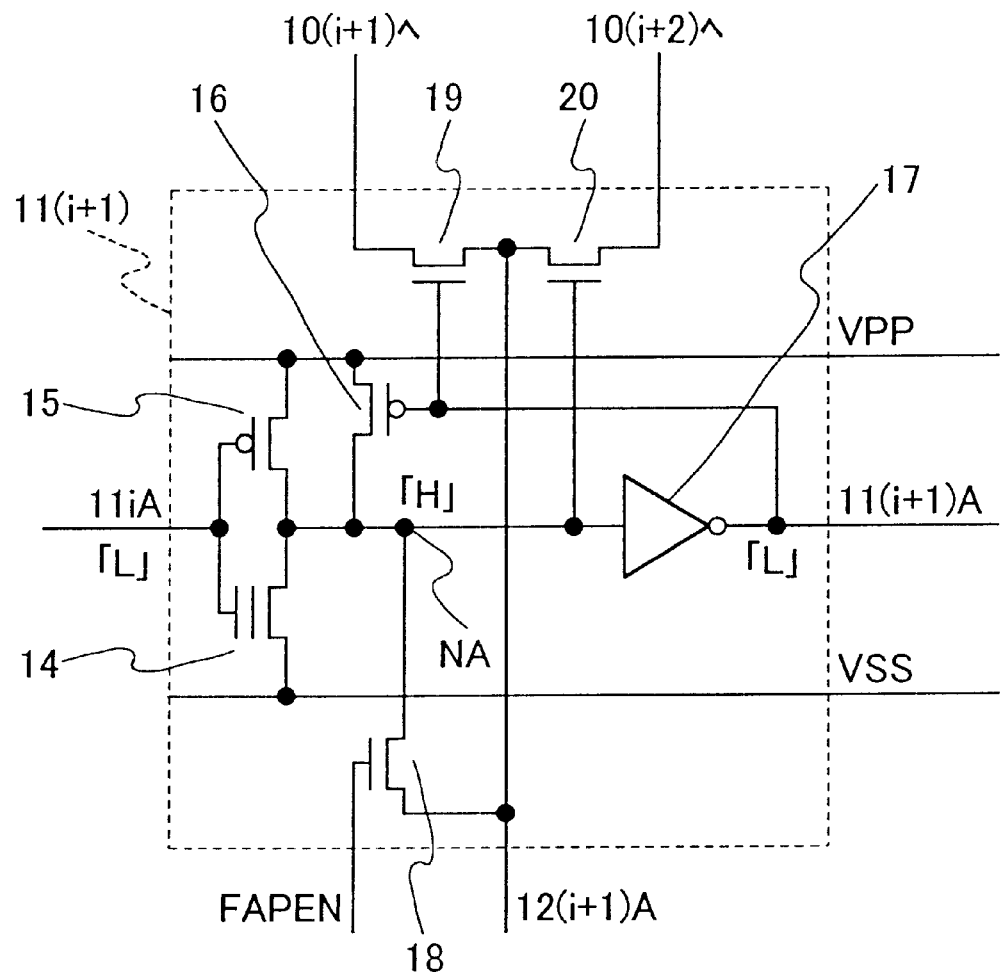
FIG. 6 illustrates an initializing operation of the redundancy control circuit in FIG. 1.
Figure 7:
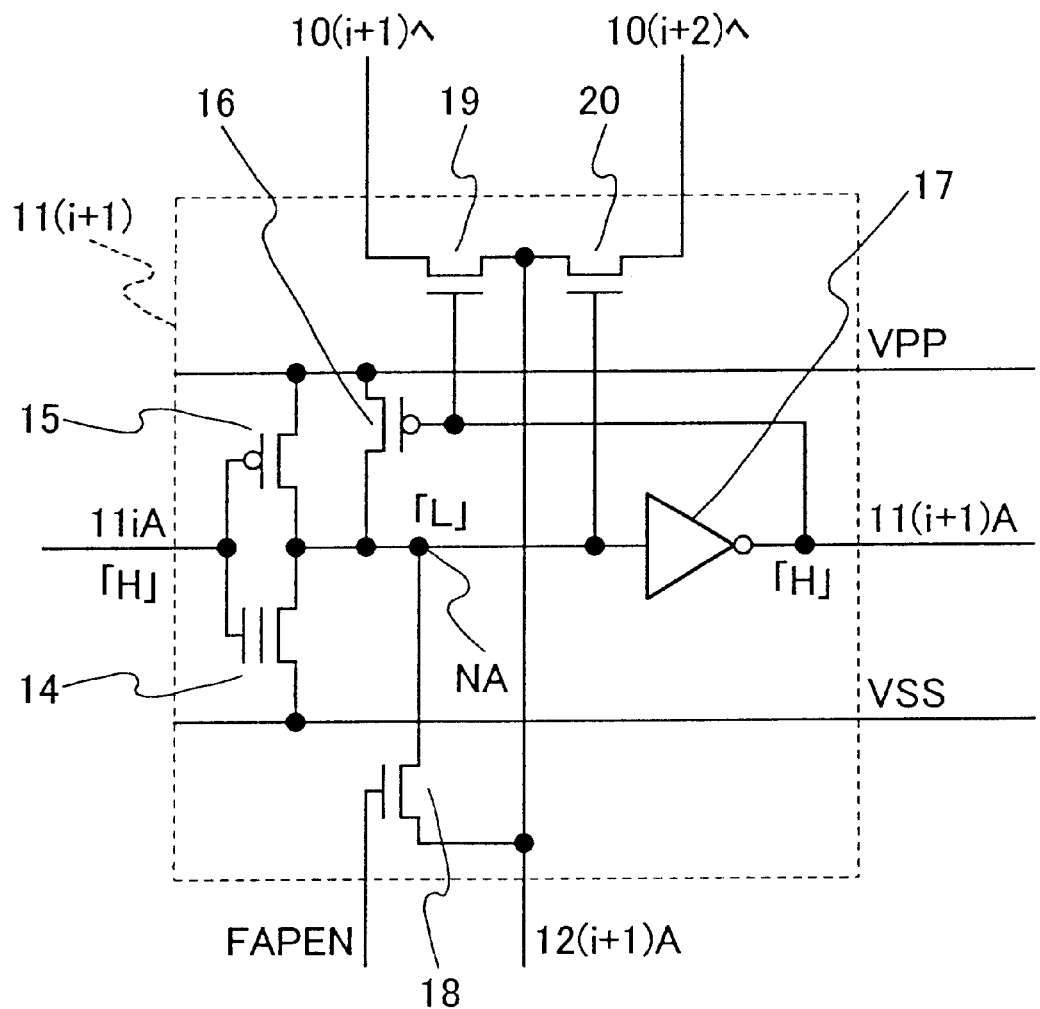
FIG. 7 illustrates an operation of the redundancy control circuit in FIG. 1 when no defect is found in the memory cells.
Figure 8:
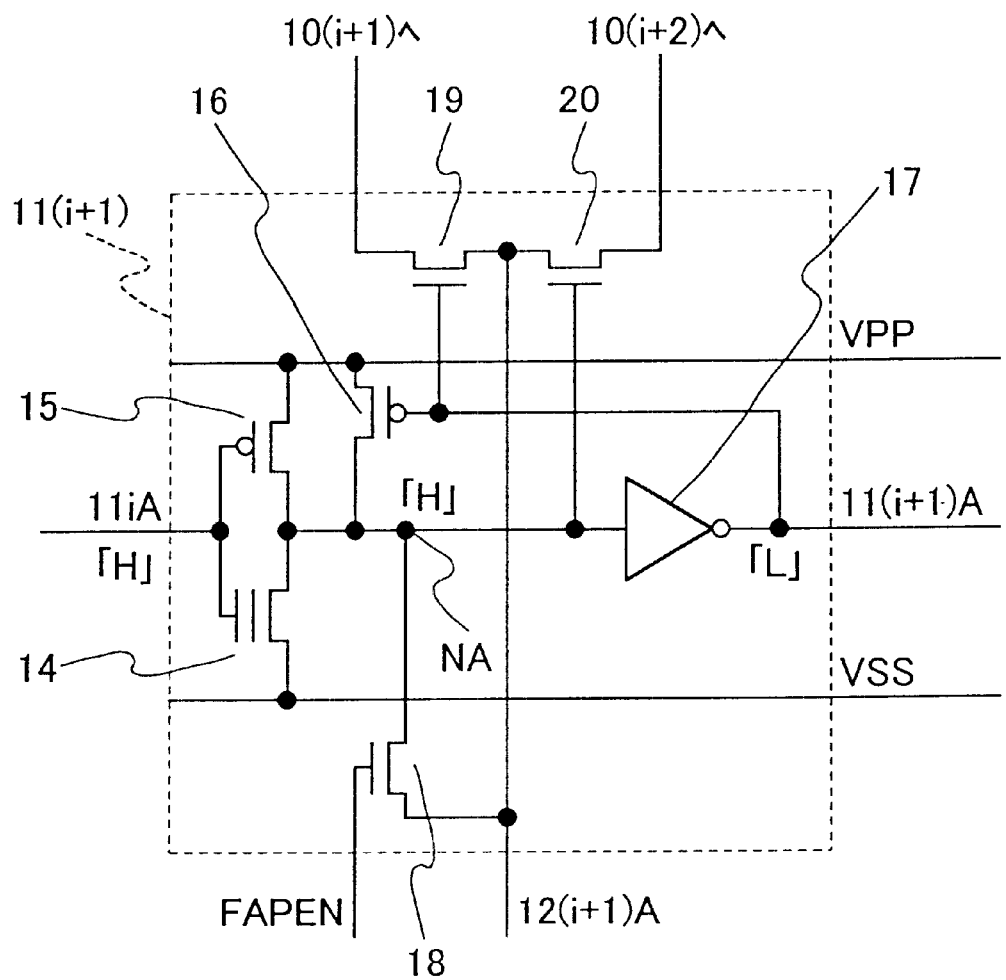
FIG. 8 illustrates an operation of the redundancy control circuit in FIG. 1 when a defect is found in the memory cells.

FIG. 5 is a circuit diagram showing the internal configuration of a redundancy control circuit 11(i+1) (i=0 to (n−2)) in the nonvolatile semiconductor memory device in FIG. 1.

In FIG. 5, reference numeral 14 is a nonvolatile memory cell, 15 and 16 are PMOS transistors, 17 is an inverter, and 18, 19 and 20 are NMOS transistors.

Gates and drains of the nonvolatile memory cell 14 and the PMOS transistor 15 are connected to each other. The gates receive an output signal 11iA from the redundancy control circuit 11i in the preceding stage. The drains are connected to a drain of the PMOS transistor 16, a source of the NMOS transistor 18 and an input terminal of the inverter 17. A gate of the PMOS transistor 16 is connected to an output terminal of the inverter 17.

An output signal 11(i+1)A from the inverter 17 is an input signal to the redundancy control circuit 11(i+2) in the next stage.

A defective address program activation signal FAPEN is applied to a gate of the NMOS transistor 18, and an output signal 12(i+1)A from an erasing decode circuit 12(i+1) is supplied to a drain of the NMOS transistor 18. The output signal 12(i+1)A from the erasing decode circuit 12(i+1) also is supplied to drains of the NMOS transistors 19, 20.

A source of the NMOS transistor 19 is connected to an input terminal of an erasing bias circuit 10(i+1), and a source of the NMOS transistor 20 is connected to an input terminal of the adjacent erasing bias circuit 10(i+2). A gate of the NMOS transistor 19 is connected to the output terminal of the inverter 17, and a gate of the NMOS transistor 20 is connected to the input terminal of the inverter 17. VPP is a power line and VSS is a ground line.

Next, the operation of a redundancy control circuit 11(i+1) of this embodiment will be described with reference to FIG. 5 and FIGS. 6 to 8.

The following is an explanation for storage of a defective address.

A high voltage signal 11iA is applied to the gate of the nonvolatile memory cell 14. Then, the defective address program activation signal FAPEN is set to a logic "H" level, and the output signal 12(i+1)A from the erasing decode circuit 12(i+1) is transmitted to a node NA through the NMOS transistor 18.

When the node NA is at a logic "H" level, the bias condition for writing data on the nonvolatile memory cell 14 is established. Thus, electrons are injected into the control gate of the nonvolatile memory cell 14 so as to increase a threshold voltage VT of the nonvolatile memory cell 14 (i.e., defective address information is stored).

When the node NA is at a logic "L" level, the bias condition for writing data on the nonvolatile memory cell 14 is not established. Thus, the threshold voltage VT is unchanged (i.e., defective address information is not stored).

In this manner, the redundancy control circuit 11(i+1) stores defective address information.

Next, an initializing operation is performed. At the time of initialization, the input signal 11ia to the redundancy control circuit 11 (i+1) has a logic "L" level. Consequently, the node NA goes to a logic "H" level, and thus the inverter 17 provides an output signal 11(i+1)A having the same logic "L" level as that of the input signal 11iA. See FIG. 6.

Upon completion of the initialization, the input signal 11iA to the redundancy control circuit 11(i+1) is changed from the logic "L" level to "H" level.

With no defective address information stored, the logic "H" level is applied to the gate of the nonvolatile memory cell 14. Since the threshold voltage VT is not increased, the nonvolatile memory cell 14 becomes conductive and the node NA goes to a logic "L" level, which is the same potential as that of the ground line VSS. Thus, the inverter 17 provides an output signal 11(i+1)A with a logic "H" level. In other words, the output signal 11(i+1)A from the redundancy control circuit 11(i+1) has the same level as that of the input signal 11iA. As a result, the NMOS transistor 19 becomes conductive, so that the erasing decode signal 12(i+1)A is transmitted to the erasing bias circuit 10(i+1) connected to the redundancy control circuit 11(i+1) on its left side. See FIG. 7.

When defective address information is stored, the threshold voltage VT of the nonvolatile memory cell 14 is increased. Therefore, even if the logic "H" level is applied to the gate of the nonvolatile memory cell 14, the memory cell becomes nonconductive and the node NA retains the logic "H" level in the initialization state. Thus, an output signal 11(i+1)A has a logic "L" level. In other words, the output signal 11(i+1)A from the redundancy control circuit 11(i+1) has an inversion level of the input signal 11iA. As a result, the NMOS transistor 20 becomes conductive, so that the erasing decode signal 12(i+1)A is transmitted to the erasing bias circuit 10(i+2) connected to the redundancy control circuit 11(i+1) on its right side. See FIG. 8.

When the output signal 11(i+1)A from the redundancy control circuit 11(i+1) in a given stage goes to a logic "L" level, the output signals 11(i+2)A to 11(n−2)A from the redundancy control circuits 11(i+2) to 11 (n−2) in the next stages have the logic "L" level, regardless of the state of the nonvolatile memory cell 14 (i.e., the nonvolatile memory cell 14 becomes nonconductive because its gate is at the logic "L" level). Consequently, the redundancy control circuits 11(i+2) to 11(n−1) transmit the erasing decode signals 12(i+2)A to 12(n−1)A to the erasing bias circuits 10(i+3) to 10n, each connected to the corresponding redundancy control circuit on its right side.

As described above, this embodiment enables redundancy replacement for each word line with simple operations by providing a nonvolatile memory cell for each erasing decode circuit.

Since defective address information is stored in the redundancy control circuit via an erasing decode signal, only the defective address program activation signal FAPEN is used as a redundancy control signal. Thus, many signals for redundancy decoding are not necessary, which enables the replacement for each word line with a simple layout.

Second Embodiment

Figure 9:
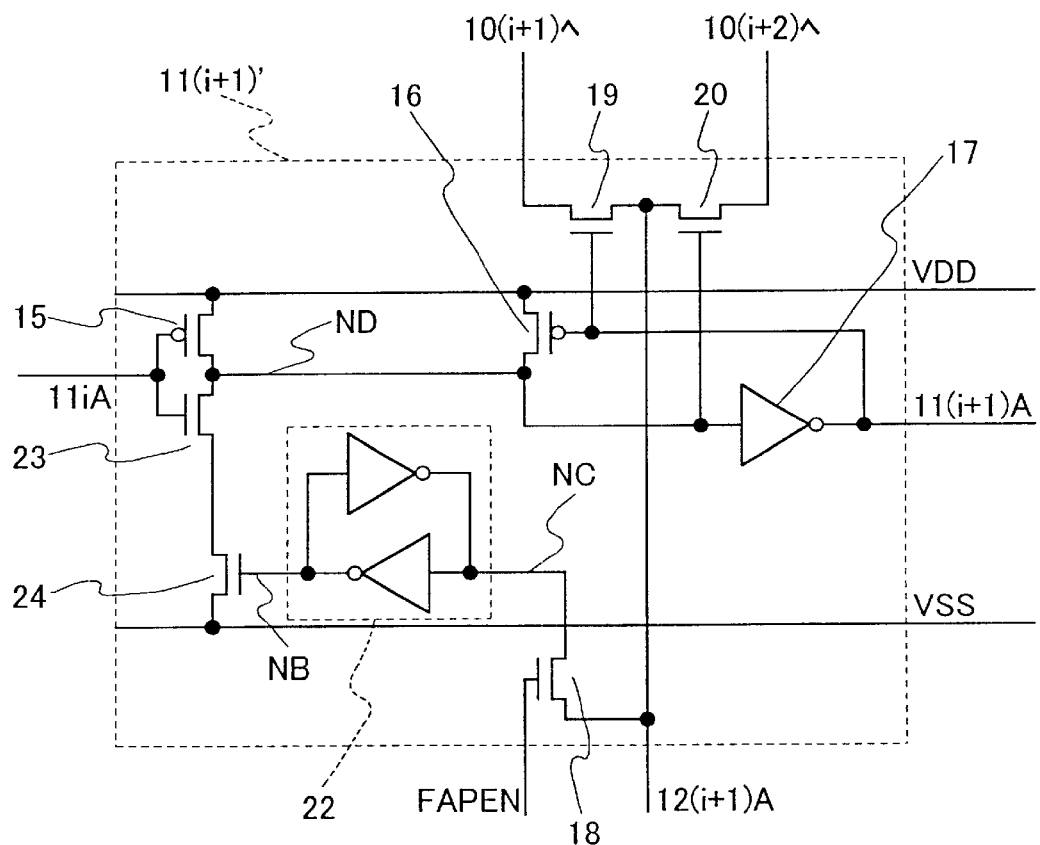
FIG. 9 is a circuit diagram showing the internal configuration of a redundancy control circuit in a nonvolatile semiconductor memory device according to a second embodiment of the present invention.
Figure 10:
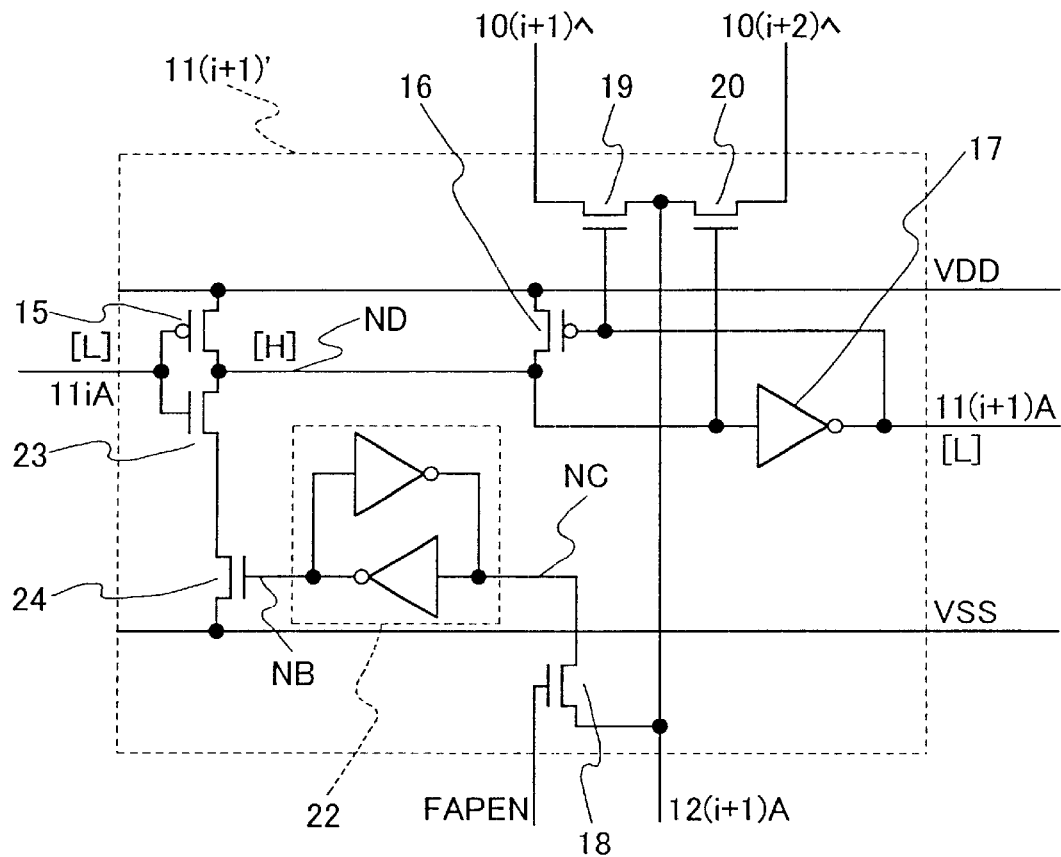
FIG. 10 illustrates an initializing operation of the redundancy control circuit in FIG. 9.
Figure 11:
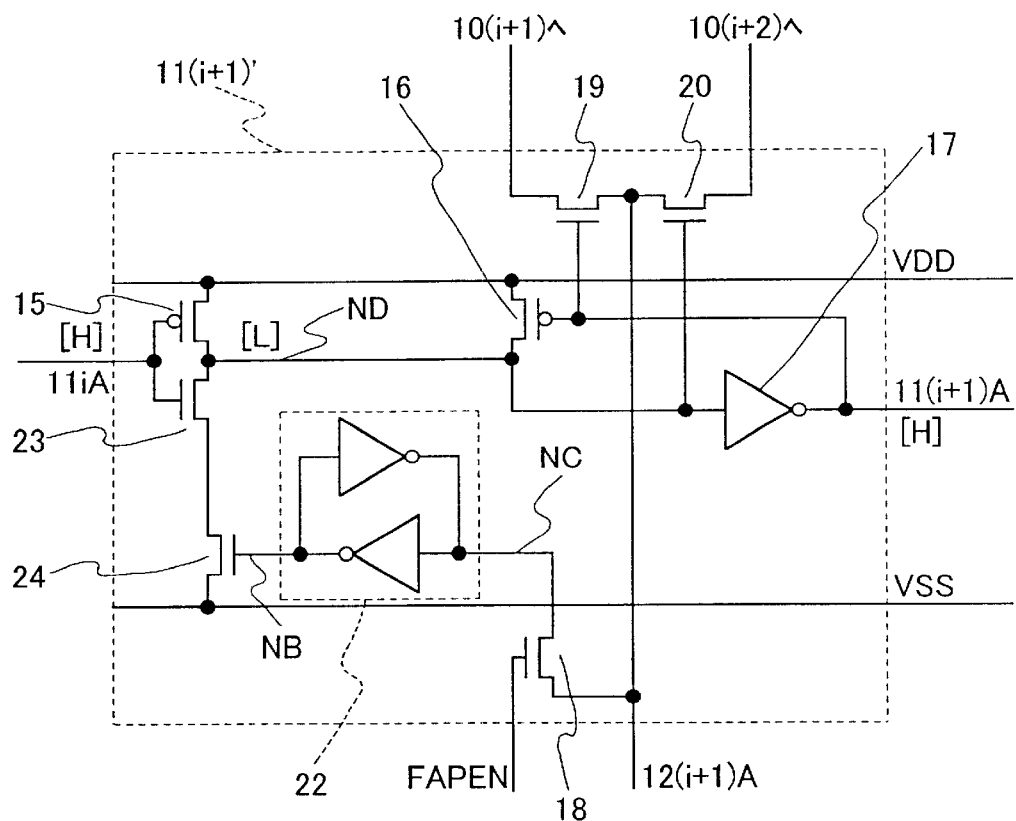
FIG. 11 illustrates an operation of the redundancy control circuit in FIG. 9 when no defect is found in the memory cells.
Figure 12:
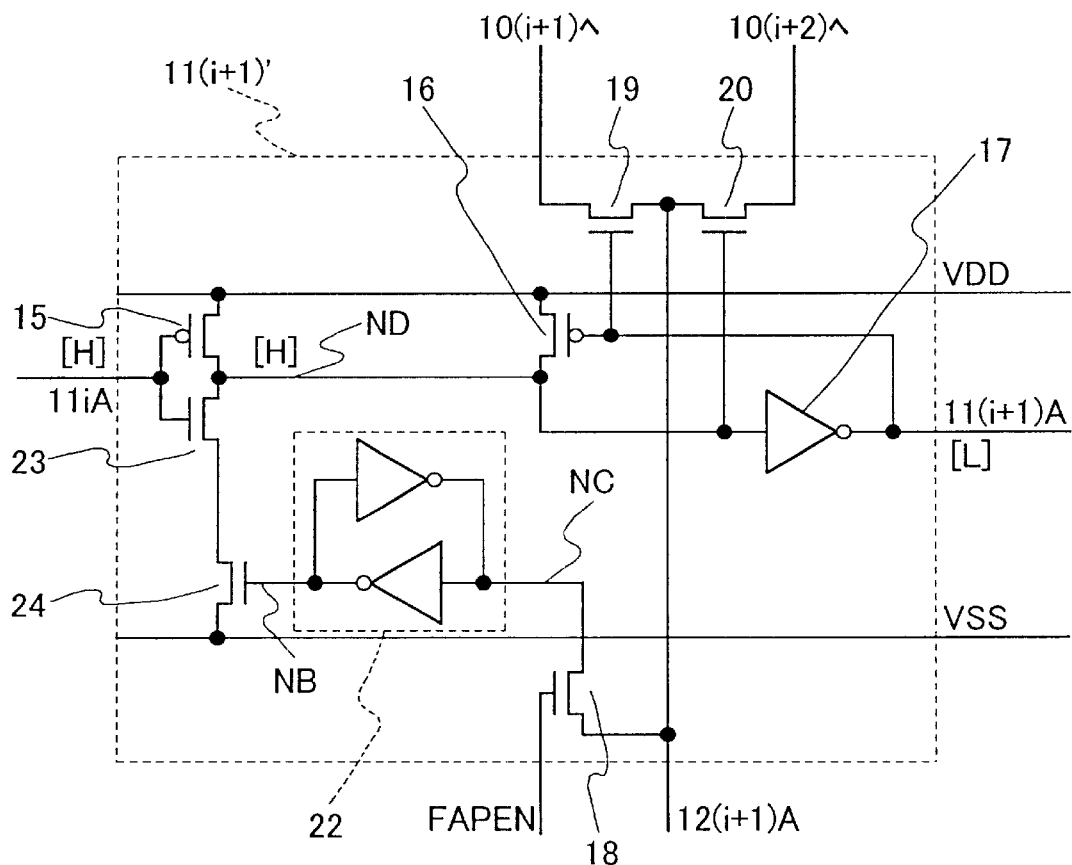
FIG. 12 illustrates an operation of the redundancy control circuit in FIG. 9 when a defect is found in the memory cells.

FIG. 9 is a circuit diagram showing the internal configuration of a redundancy control circuit 11(i+1)' (i=0 to (n−2)) in a nonvolatile semiconductor memory device of a second embodiment of the present invention.

In FIG. 9, reference numeral 22 is a static memory cell including two inverters, 15 and 16 are PMOS transistors, 17 is an inverter, and 18, 19, 20, 23 and 24 are NMOS transistors.

Gates and drains of the NMOS transistor 23 and the PMOS transistor 15 are connected to each other. The gates receive an output signal 11iA from the redundancy control circuit 11i' in the preceding stage. The drains are connected to a drain of the PMOS transistor 16 and an input terminal of the inverter 17.

A source of the NMOS transistor 23 is connected to a drain of the NMOS transistor 24, a source of the NMOS transistor 24 is connected to a ground line VSS, and a gate of the NMOS transistor 24 is connected to a node NB of the static memory cell 22.

A gate of the PMOS transistor 16 is connected to an output terminal of the inverter 17. An output signal 11(i+1)A from the inverter 17 is an input signal to the redundancy control circuit 11(i+2)' in the next stage.

A defective address program activation signal FAPEN is supplied to a gate of the NMOS transistor 18, and an output signal 12(i+1)A from an erasing decode circuit 12(i+1) is supplied to a drain of the NMOS transistor 18. The output signal 12(i+1)A from the erasing decode circuit 12(i+1) also is supplied to drains of the NMOS transistors 19, 20. A source of the NMOS transistor 19 is connected to an input terminal of an erasing bias circuit 10(i+1), and a source of the NMOS transistor 20 is connected to an input terminal of the adjacent erasing bias circuit 10(i+2). A gate of the NMOS transistor 19 is connected to the output terminal of the inverter 17, and a gate of the NMOS transistor 20 is connected to the input terminal of the inverter 17. VDD is a power line.

Next, the operation of a redundancy control circuit 11(i+1)' of this embodiment will be described with reference to FIG. 9 and FIGS. 10 to 12.

The following is an explanation for storage of a defective address.

The defective address program activation signal FAPEN is set to a logic "H" level, and the output signal 12(i+1)A from the erasing decode circuit 12(i+1) is transmitted to a node NC through the NMOS transistor 18. This allows the static memory cell 22 to retain the logic "H" level in the node NC and the logic "L" level in the node NB (i.e., defective address information is stored). In this manner, the redundancy control circuit 11 (i+1)' stores defective address information.

The defective address information may be stored, e.g., by transmitting it from another defective address information storage area in a chip to the redundancy control circuit that belongs to an array when the power of a memory is turned on.

Next, an initializing operation is performed. At the time of initialization, the input signal 11iA to the redundancy control circuit 11 (i+1)' has a logic "L" level. Consequently, a node ND goes to a logic "H" level, and thus an output signal 11(i+1)A has the same logic "L" level as that of the input signal 11iA. See FIG. 10.

Upon completion of the initialization, the input signal 11iA to the redundancy control circuit 11(i+1)' is changed from the logic "L" level to "H" level.

With no defective address information stored, the node NB of the static memory cell 22 is at a logic "H" level and the NMOS transistors 23, 24 become conductive. Therefore, the node ND goes to a logic "L" level, which is the same potential as that of the ground line VSS. Thus, the inverter 17 provides an output signal 11(i+1)A with a logic "H" level. In other words, the output signal 11(i+1)A from the redundancy control circuit 11(i+1)' has the same level as that of the input signal 11iA. As a result, the NMOS transistor 19 becomes conductive, so that the redundancy control circuit 11(i+1)' transmits the erasing decode signal 12(i+1)A to the erasing bias circuit 10(i+1) connected to the redundancy control circuit on its left side. See FIG. 11.

With defective address information stored, the node NB of the static memory cell 22 is at a logic "L" level, the NMOS transistor 24 becomes nonconductive, and the node ND retains the logic "H" level in the initialization state. Thus, the inverter 17 provides an output signal 11(i+1)A with a logic "L" level. In other words, the output signal 11(i+1)A from the redundancy control circuit 11(i+1)' has an inversion level of the input signal 11iA. As a result, the NMOS transistor 20 becomes conductive, so that the redundancy control circuit 11(i+1)' transmits the erasing decode signal 12(i+1)A to the erasing bias circuit 10(i+2) connected to the redundancy control circuit on its right side. See FIG. 12.

When the output signal 11(i+1)A from the redundancy control circuit 11(i+1)' in a given stage goes to a logic "L" level, the output signals 11(i+2)A to 11(n−2)A from the redundancy control circuits 11(i+2)' to 11(n−2)' in the next stages have the logic "L" level, regardless of the state of the static memory cell 22. Consequently, the redundancy control circuits 11(i+2)' to 11(n−1)' transmit the erasing decode signals 12(i+2)A to 12(n−1)A to the erasing bias circuits 10(i+3) to 10n, each connected to the corresponding redundancy control circuit on its right side.

As described above, this embodiment enables redundancy replacement for each word line with simple operations by providing a static memory cell for each erasing decode circuit.

Since defective address information is stored in the redundancy control circuit via an erasing decode signal, only the defective address program activation signal FAPEN is used as a redundancy control signal. Thus, many signals for redundancy decoding are not necessary, which enables the replacement for each word line with a simple layout.

Moreover, this embodiment uses the static memory cell as a means for storing defective address information. Therefore, it is not necessary to apply a high voltage, which eliminates the need for a device with a high withstand voltage. Thus, a large separation width, longer channel length, channel offset, and the like are not required to maintain a withstand voltage, simplifying the layout.

Third Embodiment

FIG. 13 is a block diagram showing the configurations of erasing decode circuits and an erasing pre-decode circuit in a nonvolatile semiconductor memory device of a third embodiment of the present invention.

In FIG. 13, reference numerals 1211 to 12ij are erasing decode circuits, 1211A to 12ijA are erasing decode signals, PXm1 to PXmi and PXn1 to PXnj are erasing pre-decode signals, 25 is an erasing pre-decode circuit, 26 is a multiplex pre-decode circuit, 27 is an address degeneration circuit, MPXA1 to MPXBn are address degeneration signals, and XA1 to XBn are erasing address signals.

In FIG. 13, the erasing decode signals 1211A to 12ijA, generated by the erasing pre-decode signals PXm1 to PXmi and PXn1 to PXnj, determine a block (memory array) to be erased. In a conventional decoding system, any one of the PXm1 to PXmi and any one of the PXn1 to PXnj are activated to select any one of the erasing decode signals 1211A to 12ijA, so that the erasing decode signal is activated.

However, this embodiment activates the desired number of signals selected from the PXm1 to PXmi and PXn1 to PXnj, thereby allowing the desired number of erasing decode signals to be activated. In other words, a block having a desired size can be erased with any combination of the erasing pre-decode signals PXm1 to PXmi, PXn1 to PXnj. Conventionally, the size of a block to be erased is set by a previously fixed decoder. On the other hand, this embodiment can change the block size without modifying the decoder by selecting the desired number of erasing blocks, which are divided into pieces in advance.

The above configuration can set the size of a block to be erased in a nonvolatile memory array flexibly with the same erasing decode circuit. Thus, modification of the erasing circuit can be made easily in accordance with the use of a memory chip.

Next, the erasing pre-decode circuit 25, acting as a generator of the erasing pre-decode signals PXm1 to PXmi, PXn1 to PXnj, will be described.

The erasing pre-decode circuit 25 receives the erasing address signals XA1 to XAm and outputs the erasing pre-decode signals PXm1 to PXmi. At the same time, it receives the erasing address signals XB1 to XBn and outputs the erasing pre-decode signals PXn1 to PXnj. The erasing address signals XA1 to XBn are input externally and can be used for writing and reading as well.

As described above, one of the erasing pre-decode signals PXm1 to PXmi (PXn1 to PXnj) is activated by the erasing address signals XA1 to XAm (XB1 to XBn) in a conventional manner. This embodiment allows two or more erasing pre-decode signals PXm1 to PXmi (PXn1 to PXnj) to be activated by the erasing address signals XA1 to XAm (XB1 to XBn).

FIGS. 14A and 14B show examples of the erasing address signals XA1 to XAm, XB1 to XBn (m=2, n=2) and the erasing pre-decode signals PXm1 to PXmi, PXn1 to PXnj (i=4, j=4). FIG. 14A is a conventional system (erasure decode specification 1), where one pre-decode signal is activated with a combination of the address signals. The corresponding erasing blocks are sixteen kinds, as indicated by the numbers 1 to 16 in FIG. 14A. FIG. 14B is a system of this embodiment (erasure decode specification 2), where the pre-decode signals are activated in a multiplex manner in response to the input address signals.

For example, concerning the data in the first two rows in FIG. 14B, each of the pre-decode signals PXB3 and PXB4 is "1", though the address signal XB2 takes "0" and "1". This means that the address signal XB2 is degenerated. In the erasure decode specification 2, five erasing blocks are selected with a combination of sixteen address signals.

As shown in FIG. 13, the erasing pre-decode circuit 25 includes the multiplex pre-decode circuit 26 and the address degeneration circuit 27. Both circuits 26 and 27 receive the erasing address signals XA1 to XAm, XB1 to XBn. The address degeneration circuit 27 determines which address signal line is degenerated for each combination of the input address signals. Therefore, the address degeneration circuit 27 outputs the same number of address degeneration signals MPXA1 to MPXAm, MPXB1 to MPXBn as that of the erasing address signals XA1 to XAm, XB1 to XBn. In the example shown in FIG. 14B, the XB1 and XB2 are degenerated. Thus, the multiplexed pre-decode signals are output, regardless of the values of the input erasing address signals XB1, XB2. The multiplex pre-decode circuit 26 degenerates any address of the input erasing address signals XA1 to XAm, XB1 to XBn (i.e., any address signal is selected) based on the address degeneration signals MPXA1 to MPXAm, MPXB1 to MPXBn and outputs the multiplexed pre-decode signals.

The above configuration provides the address degeneration circuit 27 and the multiplex pre-decode circuit 26 separately. Therefore, the erasing pre-decode signals PXm1 to PXmi, PXn1 to PXnj can be combined for multiplexing with the same multiplex pre-decode circuit 26 and only by modifying the contents of the address degeneration circuit 27. Thus, the circuit that sets the size of a block to be erased can be modified easily in accordance with the use of a memory chip.

The present invention can have the same effect when a circuit (not shown), such as a latch, is inserted in the paths of the erasing address signals XA1 to XAm, XB1 to XBn.

Next, a specific example of the circuits described in this embodiment will be explained with reference to FIG. 15. FIG. 15 is a circuit diagram of the circuits in FIG. 13 that employ the erasure decoding system in FIG. 14B when four erasing address signals (XA1, XA2, XB1, and XB2) are input.

In FIG. 15, reference numerals 1201 to 1216 are the erasing decode circuits, each of which outputs an erasing decode signal that is used to select a memory array to be erased. The erasing decode signals activate sixteen blocks individually in the erasure decode specification 1 in FIG. 14A, while they activate five blocks in the erasure decode specification 2 in FIG. 14B. PXA1 to PXA4 and PXB1 to PXB4 are erasing pre-decode signals. The multiplex pre-decode circuit 26 includes NOR circuits 28, inverters 17, and AND circuits 29A. The address degeneration circuit 27 includes inverters 17, AND circuits 29B, and logic elements 30. FIG. 15 shows OR circuits with sixteen inputs as an example of the logic elements 30.

The input stage of the address degeneration circuit 27 is a decoder with four inputs and sixteen outputs, including the inverters 17 and the AND circuits 29B. The decoder receives the erasing address signals XA1, XA2, XB1, and XB2 and outputs the decoded signals XAB1 to XAB16. These sixteen decoded signals XAB1 to XAB16 are transmitted to the four OR circuits 30, with which the address degeneration signals MPXA1 to MPXB2 are generated.

When the address XA1 is degenerated, the address degeneration signal MPXA1 is activated. The states of the decoded signals XAB1 to XAB16 determine which address signal is degenerated. In other words, the address degeneration can be performed with a combination of the input erasing address signals.

The address degeneration signals MPXA1 to MPXB2 are transmitted to the multiplex pre-decode circuit 26, which is a decoder including the NOR circuits 28, the inverters 17, and the AND circuits 29A. In the example shown in FIG. 15, the multiplex pre-decode circuit 26 is composed of two decoders, each having two inputs and four outputs (i.e., XA1, XA2→PXA1 to PXA4 and XB1, XB2→PXB1 to PXB4). When the address degeneration signals MPXA1 to MPXB2 supplied to the NOR circuits 28 are at a logic "H" level in the input stage, the input erasing address signals become invalid. Thus, the desired address can be degenerated.

FIG. 16 shows a first specific example of the OR circuit 30 in FIG. 15. In FIG. 16, sixteen pairs of NMOS transistors 18 and 19 connected in series are connected in parallel to form the OR circuit 30. Gates of the upper NMOS transistors 18 are connected to either a power terminal or ground terminal in accordance with a combination of the erasing address signals. The drains of the sixteen NMOS transistors 18 share a common node XMPXi, to which a PMOS transistor 15 normally in the on state is connected.

When the two NMOS transistors 18, 19 are on, the potential of the node XMPXi is discharged so that an output signal MPXi has a logic "H" level. In the example shown in FIG. 16, the NMOS transistors 18 are in the off state because all the gates are connected to the ground terminal. Therefore, the output signal MPXi becomes a logic "L" level. When the OR circuit 30 in FIG. 16 is used in the configuration shown in FIG. 15, each of the MPXA1 to MPXA4 has a logic "L" level, so that no address is degenerated.

This embodiment does not require sixteen NMOS transistors 18 and can achieve the same function with a sufficient number of transistors (not shown) to receive a combination of the erasing address signals of a logic "H" level.

FIG. 17 shows a second specific example of the OR circuit 30 in FIG. 15. FIG. 17 differs from FIG. 16 in that control signals GC1 to GC16 are supplied to the gates of the NMOS transistors 18. The combinations for address degeneration can be changed in accordance with the states of the control signals GC1 to GC16. The control signals GC1 to GC16 can be generated by writing control information for address degeneration into a nonvolatile memory cell (not shown). As the nonvolatile memory cell, a memory cell in the memory cell area of the nonvolatile semiconductor memory device may be used. Alternatively, it may be provided separately in the vicinity of the erasing pre-decode circuit 25.

As described above, the second specific example of the OR circuit 30 can change the combinations for address degeneration by changing the states of the control signals GC1 to GC16 in the same chip. Thus, the size of a block to be erased can be changed in the same chip, allowing the device to be used for many applications.

Figure 18:
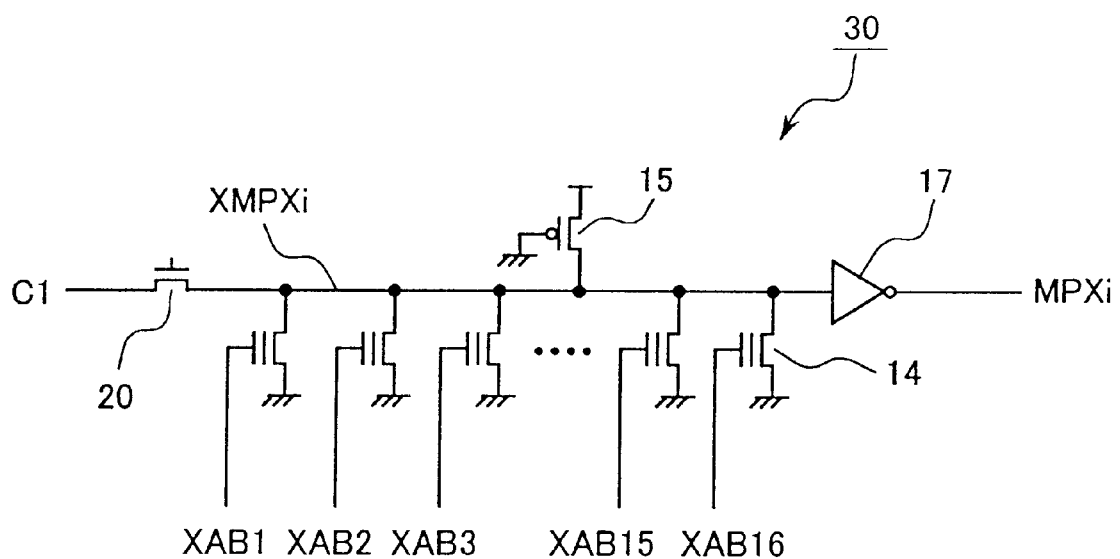
FIG. 18 is a circuit diagram showing an internal configuration of a third specific example of the OR circuit 30 in FIG. 15.

FIG. 18 shows a third specific example of the OR circuit 30 in FIG. 15. FIG. 18 differs from FIGS. 16 and 17 in that nonvolatile memory cells 14 are connected in parallel instead of the NMOS transistors 18, 19.

In FIG. 18, the drains of the nonvolatile memory cells 14 are connected to a common node XMPXi, sources thereof are connected to ground terminals, and gates thereof are supplied with the erasing address signals XAB1 to XAB16. Writing information into the nonvolatile memory cells 14 via a terminal C1 and NMOS transistor 20 determines which combination of the input erasing address signals causes address degeneration. To degenerate an address, the nonvolatile memory cells 14 whose gates are supplied with the erasing address signals of "H" level are set to be in the off state by writing information. In the example shown in FIG. 18, the nonvolatile memory cells 14 become off in writing information.

As described above, the third specific example of the OR circuit 30 can change the combinations for address degeneration by modifying the contents of the nonvolatile memory cells 14 in the address degeneration circuit 27 in the same chip. Thus, the size of a block to be erased can be changed in the same chip, allowing the device to be used for many applications. Moreover, the number of excess control signal lines can be reduced, so that a smaller layout area can be achieved.

The foregoing discussed the configuration for selecting (erasing) the desired number of memory arrays from a plurality of memory arrays as explained in the first embodiment.

Next, a combination of this embodiment and the first embodiment will be described.

Figure 19:
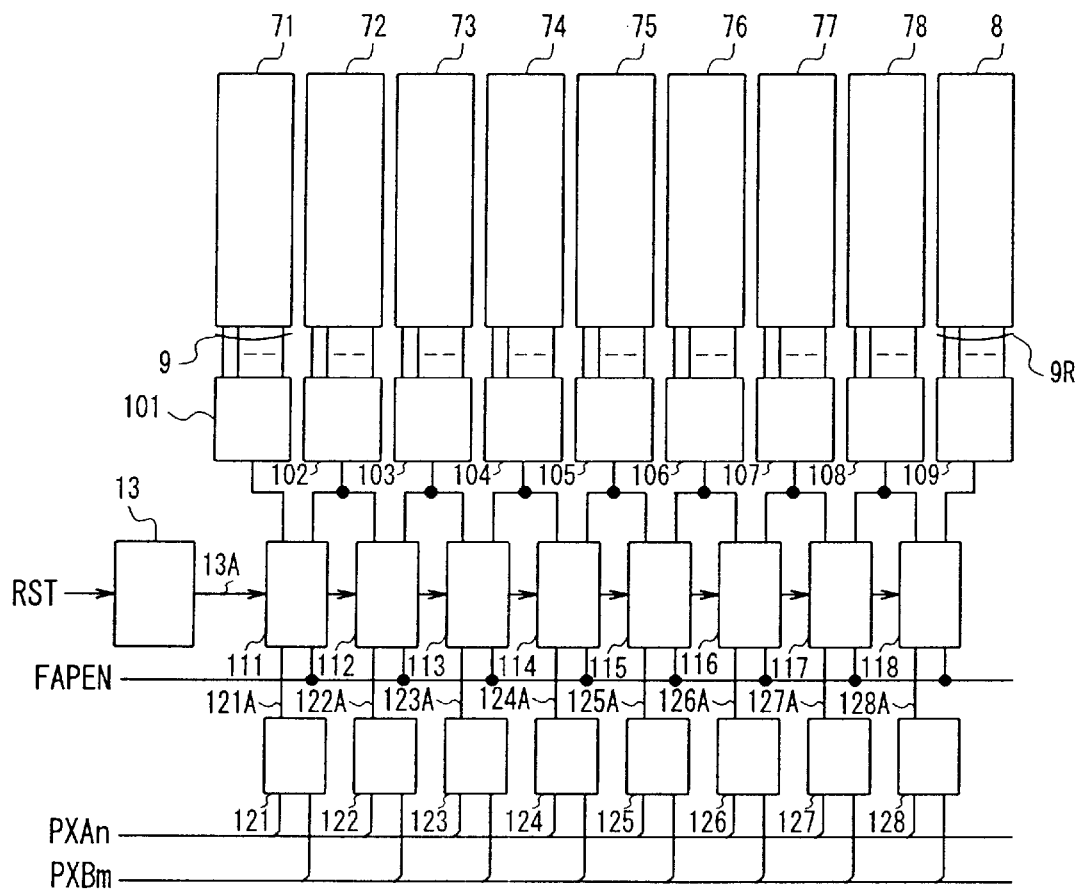
FIG. 19 shows the configuration of a memory array in a nonvolatile semiconductor memory device according to the third embodiment.

FIG. 19 shows the configuration of a memory array in a nonvolatile semiconductor memory device of this embodiment. In FIG. 19, the nonvolatile semiconductor memory device includes eight normal memory cell arrays 71 to 78, a redundant memory cell array 8, nine erasing bias application circuits 101 to 109, an initialization circuit 13, eight redundancy control circuits 111 to 118, and eight erasing decode circuits 121 to 128. PXAn and PXBm are input signals to the erasing decode circuits 121 to 128.

The operations of the memory array in FIG. 19 when including no defect and including a defect will be described respectively by referring to FIGS. 20, 21 and FIGS. 22, 23.

Figure 20:
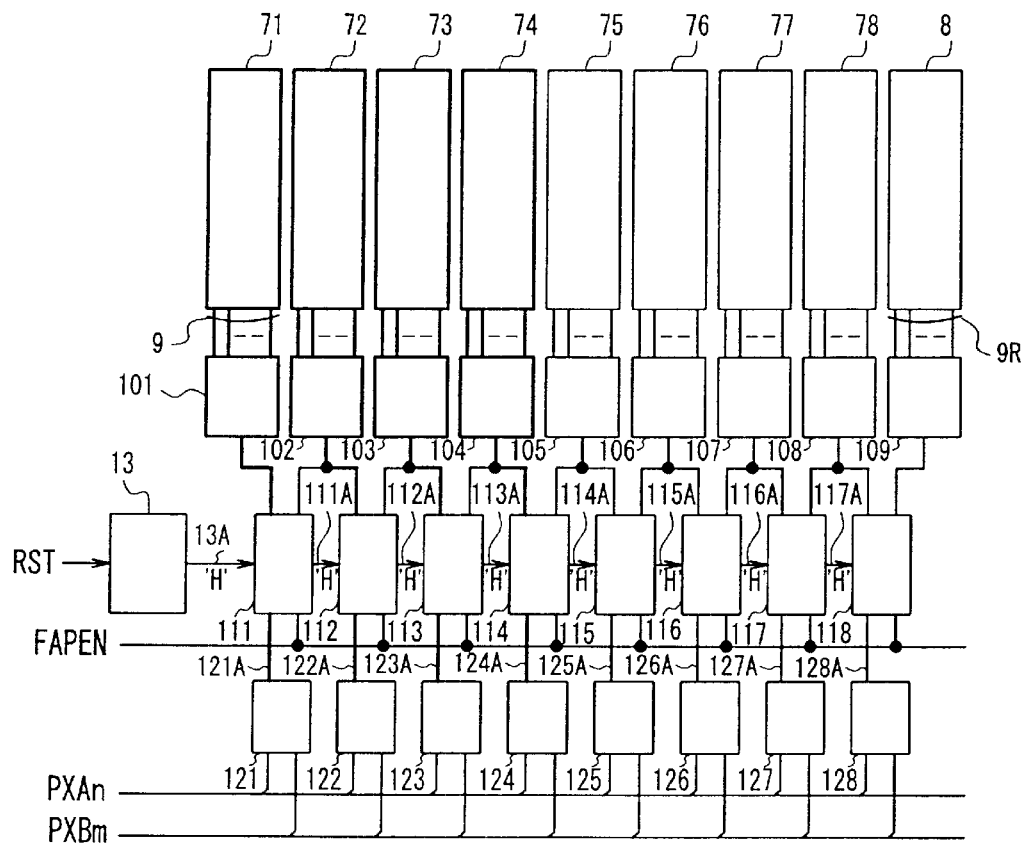
FIG. 20 shows the operation of the memory array in FIG. 19 when no defect is found in the memory cells and the outputs from the erasing decode circuits 121 to 124 are multiplexed.

In FIG. 20, the outputs from the erasing decode circuits 121 to 124 are multiplexed, and signal lines and blocks to be activated are represented by a thick line. Since no defect is found, erasing decode signals 121A to 124A are selected and all redundancy control signals 13A, 111A to 117A have a logic "H" level. Thus, the normal memory cell arrays 71 to 74 are selected.

In FIG. 21, the outputs from the erasing decode circuits 125 to 128 are multiplexed. Since no defect is found in this example, like FIG. 20, all the redundancy control signals 13A, 111A to 117A have a logic "H" level. Thus, the normal memory cell arrays 75 to 78 are selected.

In the examples shown in FIGS. 20 and 21, the redundant memory cell array 8 is not selected, and thus unnecessary erasing bias is not applied.

The following is an explanation for the case where the normal memory cell array 73 is defective.

Figure 22:
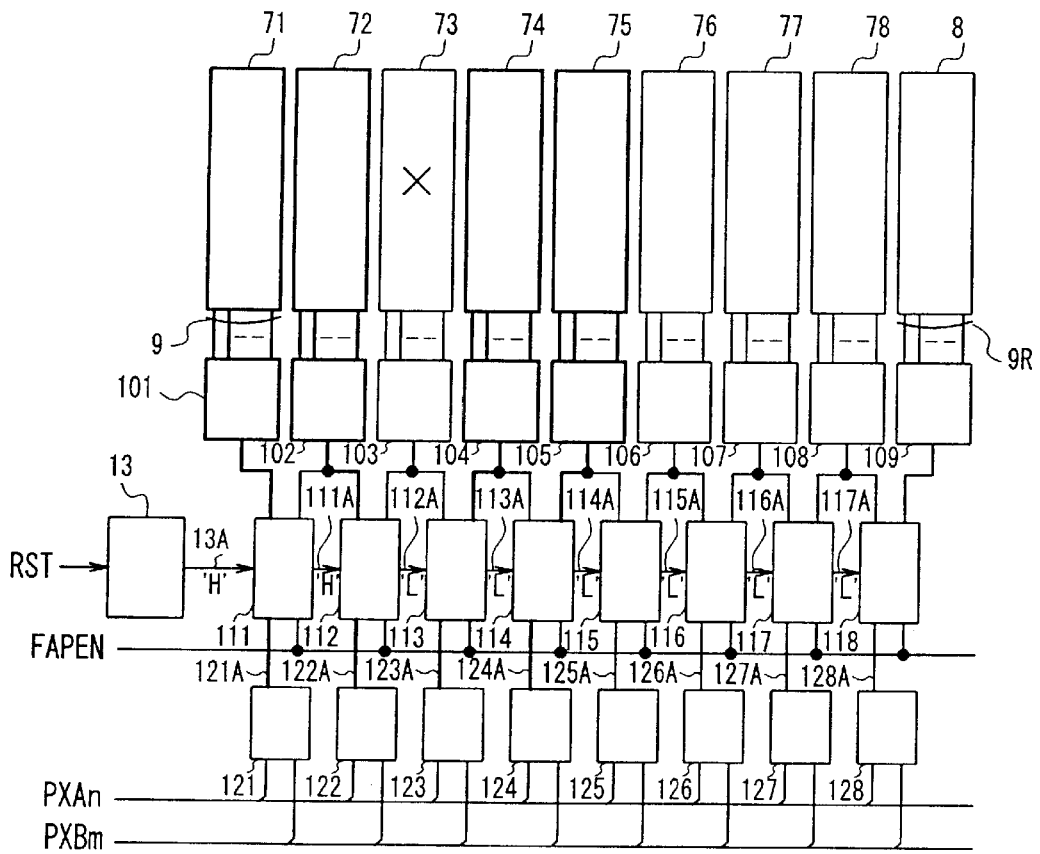
FIG. 22 shows the operation of the memory array in FIG. 19 when the normal memory cell array 73 is defective and the outputs from the erasing decode circuits 121 to 124 are multiplexed.

In FIG. 22, the outputs from the erasing decode circuits 121 to 124 are multiplexed. The erasing decode signals 121A to 124A are selected, the redundancy control signals 13A and 111A have a logic "H" level, and all the redundancy control signals 112A to 117A after the redundancy control circuit 112, in which defective address information is stored, have a logic "L" level. Thus, the normal memory cell arrays 71, 72, 74 and 75 are selected.

Figure 23:
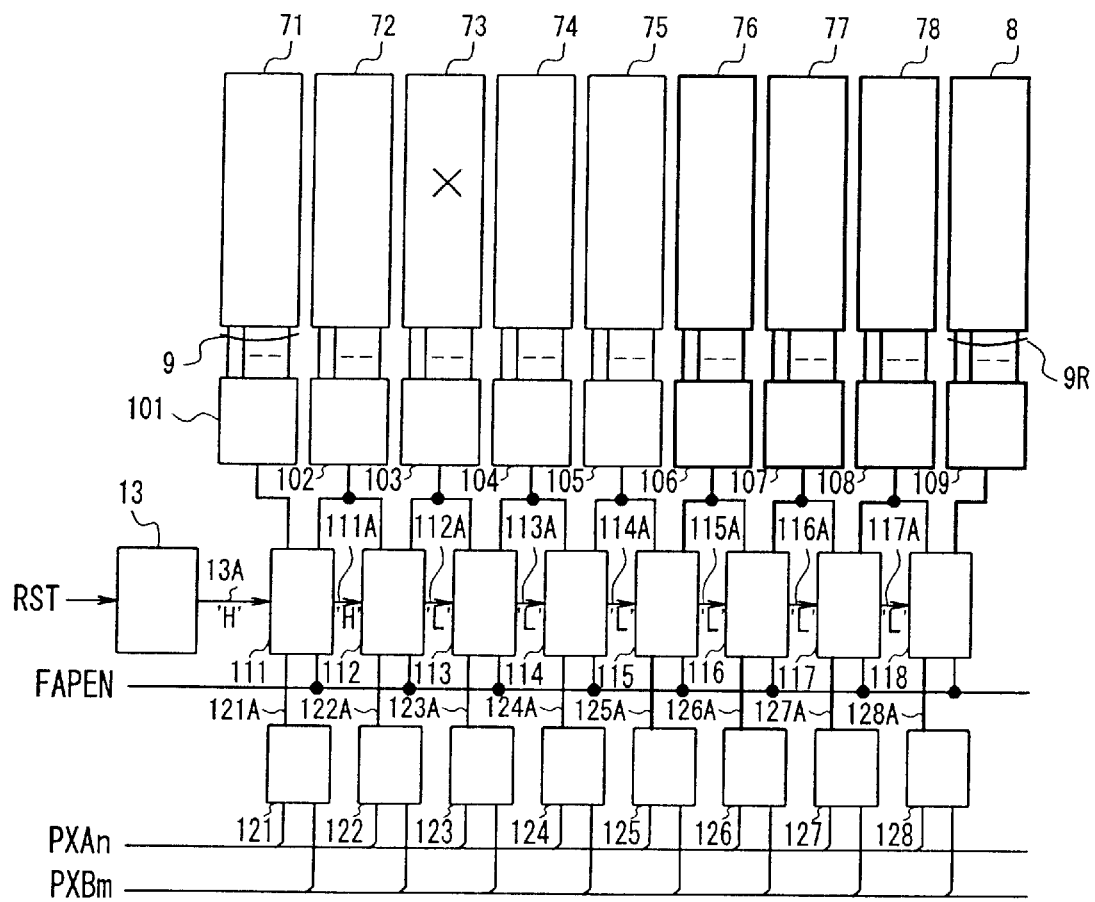
FIG. 23 shows the operation of the memory array in FIG. 19 when the normal memory cell array 73 is defective and the outputs from the erasing decode circuits 125 to 128 are multiplexed.
Figure 24:
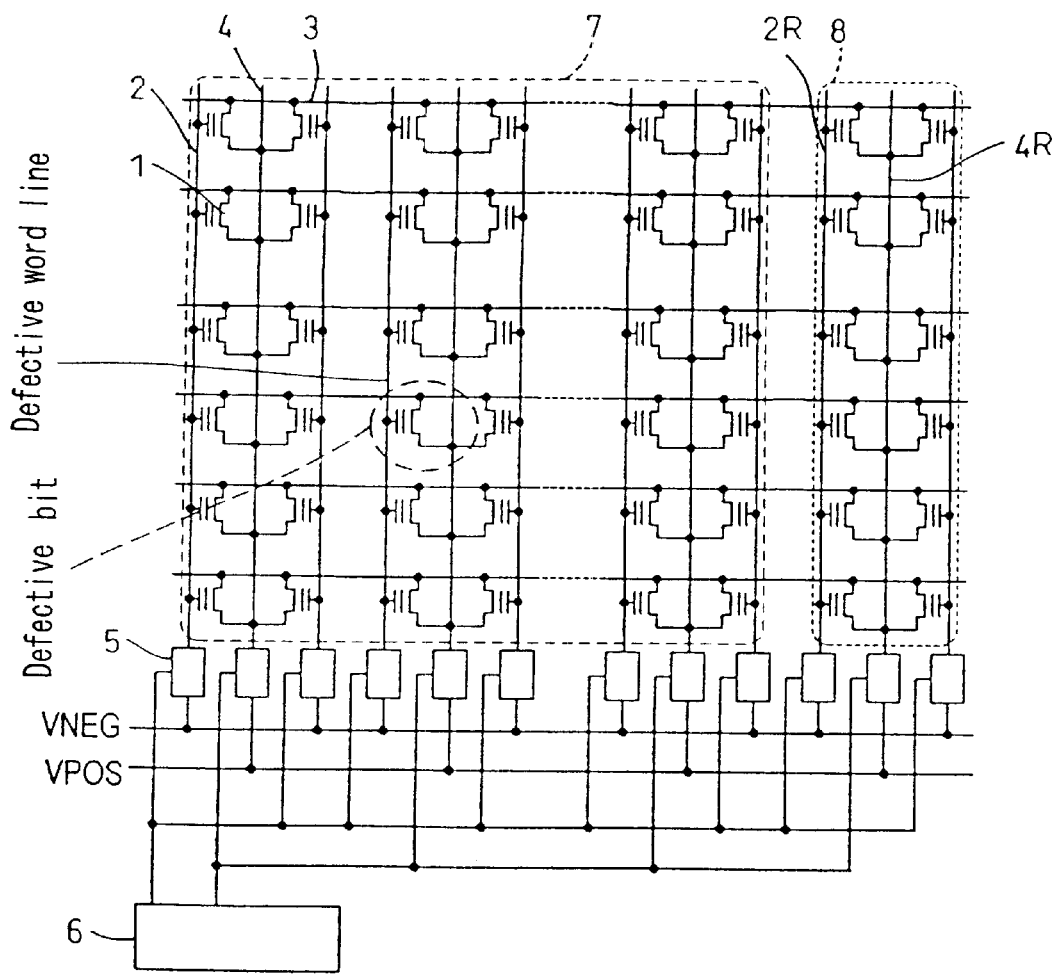
FIG. 24 shows an example of the configuration of a memory cell array in a conventional nonvolatile semiconductor memory device.
Figure 25:
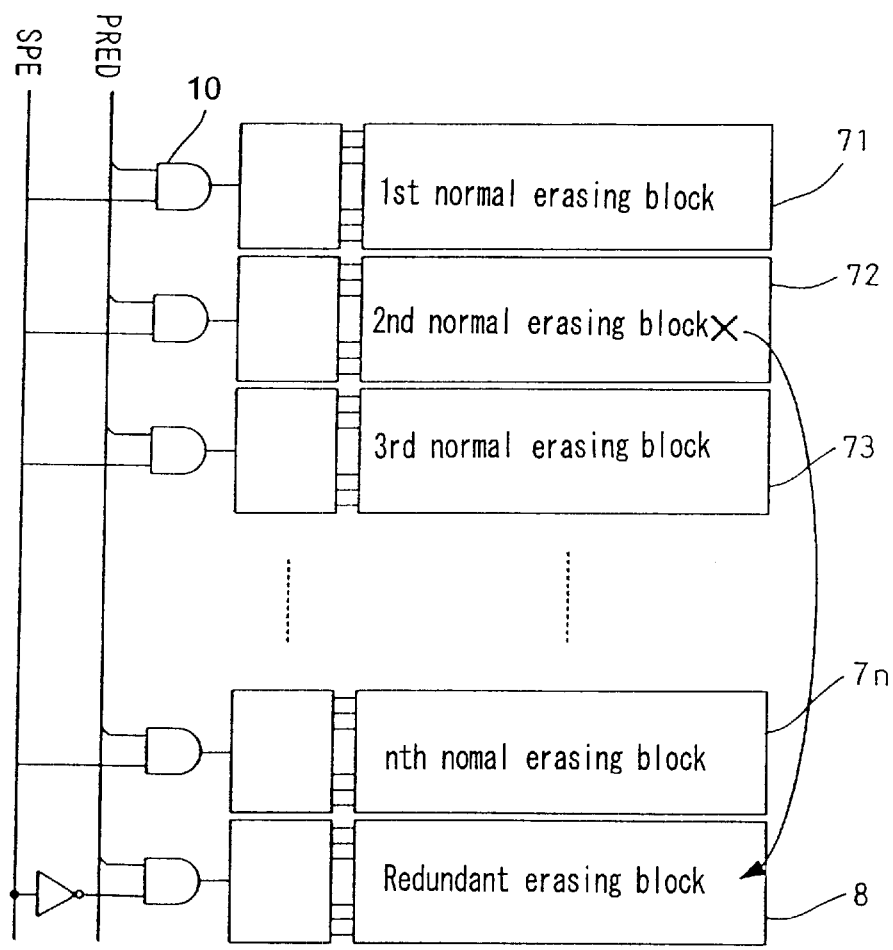
FIG. 25 shows another example of the memory cell array configuration in a conventional nonvolatile semiconductor memory device.

In FIG. 23, the outputs from the erasing decode circuits 125 to 128 are multiplexed. Like FIG. 22, the redundancy control signals 13A and 111A have a logic "H" level, and all the redundancy control signals 112A to 117A have a logic "L" level. Thus, the normal memory cell arrays 76, 77 and 78 and the redundant memory cell array 8 are selected, those memory cell arrays being located on the right sides of the redundancy control circuits 115 to 118 with respect to the drawing. The erasing bias is not applied to the other blocks.

In this manner, redundancy replacement can be performed even if arrays are selected selectively (in the examples shown in FIGS. 20, 21, 22, and 23, eight arrays formed into two blocks are selected) when one block is found to be defective.

As described above, this embodiment eliminates the application of an erasing bias to a defective memory cell array or unused redundant memory cell array. Therefore, even if arrays are selected selectively, the unused memory cells are not over-erased.

This embodiment has described the erasing decode circuit used only in an erasing mode. However, the erasing decode circuit may be used in a program mode as well. An embodiment in the program mode is explained below.

In the examples shown in FIGS. 20, 21, 22, and 23, four blocks are erased as a unit. For the program mode, the contents of the address degeneration circuit 27 are modified to differ from those in the erasing mode by, e.g., utilizing the OR circuits in FIG. 17 or 18. In other words, the address degeneration signal changes depending on the program and erasing modes. This makes it possible to select each block without, e.g., multiplexing the blocks to be selected during the program mode.

In a nonvolatile memory, a high voltage is generally applied to source lines during erasing and program modes. Therefore, the bias application to the nonvolatile memory arrays is performed by selecting the same number of source lines (selecting the same arrays) both in the erasing and program modes. However, this causes the variation in memory cell characteristics because the bias is applied even to the unselected source line (i.e., the word line is not activated) during the program mode, which is called source-line disturbance.

According to this embodiment, the number of source lines to which a bias is applied in the program mode can be made smaller than that in the erasing mode. Thus, the source-line disturbance can be reduced, thereby ensuring high reliability.

As described above, the present invention allows no erasing bias to be applied to the replaced memory cell array, so that unused memory cells are not over-erased, which prevents malfunction due to bit-line leakage.

The present invention enables the replacement of a normal memory cell array by a redundant memory cell array for each word line, thus providing a higher repair efficiency than that of a conventional replacement for each erasing block.

The present invention can set the size of a block to be erased in a nonvolatile memory array flexibly with a common erasing decode circuit. Thus, modification of the erasing circuit can be made easily in accordance with the use of a memory chip.

Also, the erasing block size can be changed in the same chip, allowing the device to be used in many applications.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A nonvolatile semiconductor memory device comprising:

N (N is a natural number) normal memory cell arrays, each comprising an arrangement of two or more nonvolatile memory cells, each having a control gate and a floating gate;

a redundant memory cell array comprising an arrangement of two or more nonvolatile memory cells, each having the same configuration as that of the nonvolatile memory cell in the normal memory cell array;

(N+1) erasing bias circuits for applying an erasing bias for erasing data stored in the N normal memory cell arrays and the redundant memory cell array;

N erasing decode circuits for decoding defective address information; and

N redundancy control circuits connected in series so that a preceding stage controls the next in order to store the defective address information for switching the (N+1) erasing bias circuits based on the defective address information responsive to output signals from the respective N erasing decode circuits, wherein the (N+1) erasing bias circuits inhibit application of the erasing bias to word and source lines connected to the control gates of any one of the N normal memory cell arrays that is replaced by the redundant memory cell array and also inhibit application of the erasing bias to word and source lines connected to the control gates of the unused redundant memory cell array under a switching operation by the N redundancy control circuits in erasing data.

2. The nonvolatile semiconductor memory device according to claim 1, wherein a size of an array of the N normal memory cell arrays is the same as that of the redundant memory cell array and is equal to or less than that of a minimum erasing block.

3. The nonvolatile semiconductor memory device according to claim 1, wherein the (N+1) erasing bias circuits apply the erasing bias to any number of memory cell arrays of the N normal memory cell arrays and the redundant memory cell array under the switching operation by the N redundancy control circuits based on output signals from the N erasing decode circuits.

4. The nonvolatile semiconductor memory device according to claim 1, wherein each of the N redundancy control circuits comprises an input terminal that receives an output signal from the erasing decode circuit and a defective address program activation signal, a first output terminal that switches an erasing bias activation signal and outputs it to one of the adjacent erasing bias circuits, and a second output terminal that switches the erasing bias activation signal and outputs it to the other erasing bias circuit, the second output terminal of one of the adjacent redundancy control circuits and the first output terminal of the other redundancy control circuit are connected in common, each of the N redundancy control circuits stores the defective address information based on the output signal from the erasing decode circuit when the defective address program activation signal is activated, and among the N redundancy control circuits, a redundancy control circuit storing the defective address information controls the next redundancy control circuit so as to switch the terminals for outputting the erasing bias activation signal.

5. The nonvolatile semiconductor memory device according to claim 1, wherein each of the N redundancy control circuits comprises a nonvolatile memory cell having a control gate and a floating gate to store the defective address information.

6. The nonvolatile semiconductor memory device according to claim 4, wherein each of the N redundancy control circuits comprises:

a nonvolatile memory cell having a gate connected to the preceding redundancy control circuit, a source connected to a first power line, and a drain connected to a common node;

a first PMOS transistor having a gate connected to the gate of the nonvolatile memory cell, a source connected to a second power line, and a drain connected to the common node;

a second PMOS transistor having a gate connected to the next redundancy control circuit, a source connected to the second power line, and a drain connected to the common node;

an inverter having an input terminal connected to the common node and an output terminal connected to the gate of the second PMOS transistor;

a first NMOS transistor having a gate receiving the defective address program activation signal, a drain connected to the common node, a source receiving the defective address information from the erasing decode circuit;

a second NMOS transistor having a gate connected to the output terminal of the inverter, a source acting as the first output terminal for switching the erasing bias activation signal to be output, and a drain connected to the source of the first NMOS transistor; and a third NMOS transistor having a gate connected to the input terminal of the inverter, a source acting as the second output terminal for switching the erasing bias activation signal to be output, and a drain connected to the source of the first NMOS transistor.

7. The nonvolatile semiconductor memory device according to claim 1, wherein each of the N redundancy control circuits comprises a static memory cell having two inverters to store the defective address information.

8. The nonvolatile semiconductor memory device according to claim 4, wherein each of the N redundancy control circuits comprises:

a static memory cell having first and second inverters, wherein an input terminal of the first inverter is connected to an output terminal of the second inverter, while an output terminal of the first inverter is connected to an input terminal of the second inverter;

a first NMOS transistor having a gate receiving the defective address program activation signal, a drain connected to one input/output terminal of the static memory cell, and a source receiving the defective address information from the erasing decode circuit;

a second NMOS transistor having a gate connected to the other input/output terminal of the static memory cell and a source connected to a first power line;

a third NMOS transistor having a gate connected to the preceding redundancy control circuit, a drain connected to a common node, and a source connected to the drain of the second NMOS transistor;

a first PMOS transistor having a gate connected to the gate of the third NMOS transistor, a drain connected to the common node, and a source connected to a second power line;

a second PMOS transistor having a gate connected to the next redundancy control circuit, a source connected to the second power line, and a drain connected to the common node;

a third inverter having an input terminal connected to the common node and an output terminal connected to the gate of the second PMOS transistor;

a fourth NMOS transistor having a gate connected to the output terminal of the third inverter, a source acting as the first output terminal for switching the erasing bias activation signal to be output, and a drain connected to the source of the first NMOS transistor; and a fifth NMOS transistor having a gate connected to the input terminal of the third inverter, a source acting as the second output terminal for switching the erasing bias activation signal to be output, and a drain connected to the source of the first NMOS transistor.

9. A nonvolatile semiconductor memory device comprising:

an erasing pre-decode circuit for receiving a plurality of erasing address signals and outputting a plurality of first and second erasing pre-decode signals, and erasing decode circuits for receiving the first and second erasing pre-decode signals and outputting a plurality of erasing decode signals, wherein the erasing pre-decode circuit comprises an address degeneration circuit for receiving the erasing address signals and outputting the same number of address degeneration signals as that of the erasing address signals and a multiplex pre-decode circuit for receiving the erasing address signals and the address degeneration signals and outputting the erasing pre-decode signals, and a combination of the erasing address signals generates any address degeneration signal so as to degenerate any address of the erasing address signals and thus any of the erasing pre-decode signals are multiplexed, whereby any combination of the erasing address signals activates a desired number of erasing pre-decode signals of the first and second erasing pre-decode signals so that a desired number of erasing decode signals are activated.

10. The nonvolatile semiconductor memory device according to claim 9, wherein the address degeneration circuit comprises a decoder for receiving the erasing address signals and a group of combinatorial logic elements that receives all outputs from the decoder and outputs the address degeneration signals.

11. The nonvolatile semiconductor memory device according to claim 10, wherein the group of combinatorial logic elements comprises OR circuits.

12. The nonvolatile semiconductor memory device according to claim 10, wherein the group of combinatorial logic elements comprises OR circuits, each receiving the same number of control signals as that of the erasing address signals and outputting the address degeneration signal in accordance with a combination of the erasing address signals and the control signals.

13. The nonvolatile semiconductor memory device according to claim 12, wherein the control signals are stored in an information storage means located separately from the address degeneration circuit on the same substrate.

14. The nonvolatile semiconductor memory device according to claim 10, wherein the group of combinatorial logic elements comprises OR circuits, each comprising the same number of nonvolatile memory cells as that of the erasing address signals, control gates of the nonvolatile memory cells are each supplied with the erasing address signal and drains thereof are connected in common to form an output node of the OR circuit, and the OR circuit outputs the address degeneration signal in accordance with a combination of the erasing address signals and information stored in the nonvolatile memory cells.

15. The nonvolatile semiconductor memory device according to claim 14, wherein desired information is stored in the nonvolatile memory cells by supplying the erasing address signals to each of the control gates of the nonvolatile memory cells and applying a desired voltage to the output node of the OR circuit.

16. The nonvolatile semiconductor memory device according to claim 1, further comprising an erasing pre-decode circuit comprising an address degeneration circuit for receiving a plurality of erasing address signals and outputting the same number of address degeneration signals as that of the erasing address signals and a multiplex pre-decode circuit for receiving the erasing address signals and the address degeneration signals and outputting a plurality of first and second erasing pre-decode signals, wherein the erasing decode circuits receive the first and second erasing pre-decode signals from the erasing pre-decode circuit and output erasing decode signals, with which any number of normal memory cell arrays in a plurality of combinations are activated so as to repair a defective address of any one of those normal memory cell arrays.

17. The nonvolatile semiconductor memory device according to claim 16, wherein the erasing decode circuits are shared in an erasing mode and a program mode, and a number of source lines to be selected in the program as zmode is made smaller than that in the erasing mode by changing the activated address degeneration signals depending on the erasing and program modes.

* * * * *